(12) United States Patent
Morita

(10) Patent No.: US 10,490,115 B2
(45) Date of Patent: Nov. 26, 2019

(54) DISPLAY DRIVER, ELECTRO-OPTICAL DEVICE, AND ELECTRONIC APPARATUS

(71) Applicant: SEIKO EPSON CORPORATION, Tokyo (JP)

(72) Inventor: Akira Morita, Chino (JP)

(73) Assignee: SEIKO EPSON CORPORATION, Tokyo (JP)

( * ) Notice: Subject to any disclaimer, the term of this patent is extended or adjusted under 35 U.S.C. 154(b) by 0 days.

(21) Appl. No.: 16/123,923

(22) Filed: Sep. 6, 2018

(65) Prior Publication Data

US 2019/0073940 A1 Mar. 7, 2019

(30) Foreign Application Priority Data

Sep. 7, 2017 (JP) .................. 2017-171682

(51) Int. Cl.
*G09G 3/20* (2006.01)
*H03F 3/45* (2006.01)
(Continued)

(52) U.S. Cl.
CPC ......... *G09G 3/2092* (2013.01); *G09G 3/3688* (2013.01); *G09G 3/3696* (2013.01); *H03F 1/223* (2013.01); *H03F 3/4521* (2013.01); *H03F 3/45475* (2013.01); *H03F 3/505* (2013.01); *G09G 3/3225* (2013.01); *G09G 3/3648* (2013.01); *G09G 2310/027* (2013.01); *G09G 2310/0254* (2013.01); *G09G 2310/0289* (2013.01); *G09G 2310/0291* (2013.01); *G09G 2310/0294* (2013.01); *G09G 2330/028* (2013.01); *H03F 2200/129* (2013.01);
(Continued)

(58) Field of Classification Search
CPC ............... G09G 3/2092; G09G 3/3648; G09G 2310/027; G09G 2310/0291; H03F 3/4521; H03F 2203/45151; H03F 2200/129
See application file for complete search history.

(56) References Cited

U.S. PATENT DOCUMENTS 6,014,122 A 1/2000 Hashimoto
2002/0126106 A1 9/2002 Naito
(Continued)

FOREIGN PATENT DOCUMENTS

JP H03-107594 A 5/1991
JP H04-55889 A 2/1992
(Continued)

*Primary Examiner* — Shaheda A Abdin
(74) *Attorney, Agent, or Firm* — Oliff PLC

(57) ABSTRACT

A display driver includes a digital-to-analog (D/A) converting circuit, an inverting amplifier circuit, and current compensating circuits. The D/A converting circuit converts display data into a gradation voltage. The inverting amplifier circuit includes an operational amplifier, a resistor provided between an input node to which the gradation voltage is input and an inverting input terminal of the operational amplifier, and a resistor provided between an output terminal of the operational amplifier and the inverting input terminal. The current compensating circuit causes a compensation current to flow from a first node of a first supply voltage to an input node. The current compensating circuit causes a compensation current to flow from the input node to a second node of a second supply voltage.

18 Claims, 13 Drawing Sheets

(51) Int. Cl.
*G09G 3/36* (2006.01)
*H03F 1/22* (2006.01)
*H03F 3/50* (2006.01)
*G09G 3/3225* (2016.01)

(52) U.S. Cl.
CPC .............. *H03F 2203/45151* (2013.01); *H03F 2203/45528* (2013.01); *H03F 2203/45594* (2013.01)

(56) References Cited

U.S. PATENT DOCUMENTS

| | | | |
|---|---|---|---|
| 2004/0196087 A1* | 10/2004 | Kurose | H03F 3/345 327/336 |
| 2007/0085608 A1 | 4/2007 | Iriguchi et al. | |
| 2008/0231641 A1* | 9/2008 | Miyashita | G09G 3/3655 345/619 |
| 2008/0303770 A1 | 12/2008 | Oke et al. | |
| 2009/0303162 A1 | 12/2009 | Kohno et al. | |
| 2011/0205193 A1 | 8/2011 | Nishimura et al. | |
| 2012/0127138 A1 | 5/2012 | Tsuchi | |
| 2013/0151037 A1 | 6/2013 | Harumoto et al. | |
| 2015/0049073 A1* | 2/2015 | Morita | G09G 3/3614 345/211 |
| 2015/0194115 A1 | 7/2015 | Tsuchi | |

FOREIGN PATENT DOCUMENTS

| | | |
|---|---|---|
| JP | H10-260664 A | 9/1998 |
| JP | 2001-67047 A | 3/2001 |
| JP | 2005-292856 A | 10/2005 |
| JP | 2007-096504 A | 4/2007 |
| JP | 2008-304806 A | 12/2008 |
| JP | 2009-294376 A | 12/2009 |
| JP | 2011-172066 A | 9/2011 |
| JP | 2012-114628 A | 6/2012 |
| JP | 2012-137571 A | 7/2012 |
| JP | 2013-123095 A | 6/2013 |
| JP | 2013-195491 A | 9/2013 |

* cited by examiner

DISPLAY DRIVER, ELECTRO-OPTICAL DEVICE, AND ELECTRONIC APPARATUS

The present application is based on and claims priority from JP Application Serial Number 2017-171682, filed Sep. 7, 2017, the disclosure of which is hereby incorporated by reference herein in its entirety.

BACKGROUND

1. Technical Field

The disclosure relates to a display driver, an electro-optical device, and an electronic apparatus.

2. Related Art

A display driver that drives an electro-optical panel includes a ladder resistance circuit that generates a plurality of voltages, a digital-to-analog (D/A) converting circuit that selects a gradation voltage corresponding to display data from the plurality of voltages, and an amplifier circuit that amplifies or buffers the gradation voltage (impedance conversion). A known technology of such a display driver is disclosed in, for example, JP-A-2005-292856, JP-A-2001-67047, and JP-A-10-260664.

In JP-A-2005-292856, a display driver includes a forward amplifier circuit as an amplifier circuit. In other words, a gradation voltage is input to a non-inverting input terminal (positive terminal) of an operational amplifier, and a feedback voltage is input to an inverting input terminal (negative terminal).

In JP-A-2001-67047 and JP-A-10-260664, a display driver includes an inverting amplifier circuit as an amplifier circuit. A first capacitor is provided between an input node of the inverting amplifier circuit and an inverting input terminal of an operational amplifier. A second capacitor is provided between the inverting input terminal and an output terminal of the operational amplifier. A gradation voltage is input to a non-inverting input terminal of the operational amplifier.

In a case where a non-inverting amplifier circuit as in JP-A-2005-292856 or a voltage follower circuit is adopted as an amplifier circuit of a display driver, a bias point of a differential pair of an operational amplifier fluctuates depending on a gradation. A gain of a differential pair generally fluctuates when a bias point fluctuates. Thus, it may be difficult to achieve a high gain in the entire fluctuation range of a bias point. For example, a gain decreases as a bias point approaches a power supply voltage, and a gain is to be designed in a fluctuation range of a bias point according to the decreased gain.

A technique using an inverting amplifier circuit is conceivable to reduce fluctuation of a bias point of a differential pair. In a certain inverting amplifier circuit in which a feedback circuit is configured with a resistor, a current flows between an output node and an input node through the resistor. Thus, the current flows into a ladder resistance circuit through a D/A converting circuit, and an error may be caused in gradation voltage. On the other hand, in another inverting amplifier circuit in which a feedback circuit is configured with a capacitor as in JP-A-2001-67047 and JP-A-10-260664, an electrical charge of the capacitor needs to be initialized. For example, this initialization time may cause a drive time to shorten. Alternatively, since an electrical charge is accumulated in the capacitor, the inverting amplifier circuit may be easily affected by noise.

SUMMARY

According to some aspects of the disclosure, while an inverting amplifier circuit in which a feedback circuit is configured with a resistor is adopted, a display driver, an electro-optical device, and an electronic apparatus, capable of eliminating or reducing an error in gradation voltage are provided.

One aspect of the disclosure is related to a display driver including a digital/analog (D/A) converting circuit configured to convert display data into a gradation voltage, an inverting amplifier circuit including an operational amplifier including a non-inverting input terminal to which a reference voltage is input, a first resistor provided between an input node to which the gradation voltage is input and an inverting input terminal of the operational amplifier, and a second resistor provided between an output terminal of the operational amplifier and the inverting input terminal, a first current compensating circuit provided between the input node of the inverting amplifier circuit and a first node of a first supply voltage, and configured to cause a first compensation current to flow from the first node of the first supply voltage to the input node of the inverting amplifier circuit, and a second current compensating circuit provided between the input node of the inverting amplifier circuit and a second node of a second supply voltage, the second supply node being lower than the first supply voltage, and configured to cause a second compensation current to flow from the input node of the inverting amplifier circuit to the second node of the second supply voltage.

According to one aspect of the disclosure, the first current compensating circuit causes the first compensation current to flow from the first node of the first supply voltage to the input node of the inverting amplifier circuit, and the second current compensating circuit causes the second compensation current to flow from the input node of the inverting amplifier circuit to the second node of the second supply voltage. Thus, a current flowing between the input node of the inverting amplifier circuit and a ladder resistance circuit through the D/A converting circuit can be compensated (reduced or canceled). Thus, while the inverting amplifier circuit including the first and second resistors provided as feedback circuits between the input node and the output node is adopted, an error in the gradation voltage output from the D/A converting circuit can be reduced (or canceled).

Further, in one aspect of the disclosure, the first current compensating circuit may cause the first compensation current to flow, in a case where an output voltage of the inverting amplifier circuit is lower than the reference voltage, and the second current compensating circuit may cause the second compensation circuit to flow, in a case where the output voltage of the inverting amplifier circuit is higher than the reference voltage.

In this way, in a negative period in which the output voltage of the inverting amplifier circuit is lower than the reference voltage, at least a part of the current flowing from the input node to the output node of the inverting amplifier circuit can be supplied from the first current compensating circuit. In a positive period in which the output voltage of the inverting amplifier circuit is higher than the reference voltage, at least a part of the current flowing from the output node to the input node of the inverting amplifier circuit can be absorbed by the second current compensating circuit.

Thus, the current flowing between the input node of the inverting amplifier circuit and the ladder resistance circuit through the D/A converting circuit can be reduced.

Further, in one aspect of the disclosure, the first current compensating circuit may cause the first compensation current having a current value increased with an increased difference between the output voltage of the inverting amplifier circuit and the reference voltage to flow, in a case where the output voltage of the inverting amplifier circuit is lower than the reference voltage, and the second current compensating circuit may cause the second compensation circuit having a current value increased with an increased difference between the output voltage of the inverting amplifier circuit and the reference voltage to flow, in a case where the output voltage of the inverting amplifier circuit is higher than the reference voltage.

The magnitude of the current flowing between the output node and the input node of the inverting amplifier circuit increases with a greater voltage difference between the output voltage of the inverting amplifier circuit and the reference voltage. Thus, the current flowing between the output node and the input node of the inverting amplifier circuit can be effectively compensated by causing the first and second compensation currents having a current value increased with a greater voltage difference between the output voltage of the inverting amplifier circuit and the reference voltage to flow.

Further, in one aspect of the disclosure, the display driver may further include an operational circuit configured to perform operational processing based on the display data, and to output first setting data for setting a current value of the first compensation current and second setting data for setting a current value of the second compensation current, and the first current compensating circuit may output the first compensation current having a current value set by the first setting data, and the second current compensating circuit may output the second compensation current having a current value set by the second setting data.

In this way, the operational circuit obtains the first setting data and the second setting data based on the display data. Hence, the first and second compensation currents each having a current value corresponding to a gradation value of the display data (namely, the output voltage of the inverting amplifier circuit) can be output.

Further, in one aspect of the disclosure, the operational circuit may output the first setting data for increasing a current value of the first compensation current with an increased difference between a gradation value of the display data and a gradation value corresponding to the reference voltage in a positive period of polarity inversion driving, and may output the second setting data for increasing a current value of the second compensation current with an increased difference between a gradation value of the display data and a gradation value corresponding to the reference voltage in a negative period of the polarity inversion driving.

In this way, by outputting the first setting data and the second setting data for increasing current values of the first and second compensation currents as the difference between the gradation value of the display data and the gradation value corresponding to the reference voltage is greater, the first and second compensation currents each having a current value increased with an increased difference between the output voltage of the inverting amplifier circuit and the reference voltage can be flowed.

Further, in one aspect of the disclosure, the display driver may further include a ladder resistance circuit configured to generate a plurality of voltages, and the D/A converting circuit may select a voltage corresponding to the display data from the plurality of voltages and output the voltage as the gradation voltage.

A voltage value of the gradation voltage is determined by resistance division of the ladder resistance circuit. Thus, when a current flows between the input node of the inverting amplifier circuit and the ladder resistance circuit through the D/A converting circuit, an error may occur in the gradation voltage. According to one aspect of the disclosure, the first and second current compensating circuits cause the first and second compensation currents to flow, and thus the current flowing between the input node of the inverting amplifier circuit and the ladder resistance circuit through the D/A converting circuit can be reduced.

Further, in one aspect of the disclosure, the operational amplifier may include a first transistor and a second transistor constituting a differential pair, a third transistor and a fourth transistor constituting a current mirror circuit, a fifth transistor that is provided between the first transistor and the third transistor and includes a gate to which a given bias voltage is input, and a sixth transistor that is provided between the second transistor and the fourth transistor and includes a gate to which the given bias voltage is input.

In this way, sensitivity (gain) of the operational amplifier is extremely increased near an operating point of a differential pair. In other words, a change in drain voltage of the first transistor with respect to a change in differential input is substantially increased by the fifth and sixth transistors, and, as a result, sensitivity (gain) of the operational amplifier is substantially increased. In one aspect of the disclosure, since an operating point of a differential pair is limited to the reference voltage (near the reference voltage), an operational amplifier having a configuration with high sensitivity near the operating point can be adopted. Thus, the operational amplifier becomes an ideal operational amplifier, and an error in the output voltage from the inverting amplifier circuit can be reduced (data voltage can achieve enhanced precision).

Further, another aspect of the disclosure is related to a display driver including a D/A converting circuit configured to convert display data into a gradation voltage, an inverting amplifier circuit including an operational amplifier including a non-inverting input terminal to which a reference voltage is input, a first resistor provided between an input node and an inverting input terminal of the operational amplifier, and a second resistor provided between an output terminal of the operational amplifier and the inverting input terminal, and a voltage follower circuit configured to receive an input of the gradation voltage from the D/A converting circuit, and to output a voltage corresponding to the gradation voltage to the input node of the inverting amplifier circuit.

According to another such aspect of the disclosure, the voltage follower circuit impedance-converts the gradation voltage to output the converted voltage to the input node of the inverting amplifier circuit, and can thus absorb a current flowing between the input node and the output node of the inverting amplifier circuit. Thus, no current flows between the output node of the D/A converting circuit and the ladder resistance circuit. In this way, while the inverting amplifier circuit including the first and second resistors provided as feedback circuits between the input node and the output node is adopted, an error in the gradation voltage output from the D/A converting circuit can be reduced (or canceled).

Further, still another aspect of the disclosure is related to an electro-optical device including the display driver described in any of the description above, and an electro-optical panel configured to be driven by the display driver.

Further, still another aspect of the disclosure is related to an electronic apparatus including the display driver described in any of the description above.

BRIEF DESCRIPTION OF THE DRAWINGS

Embodiments of the disclosure will be described with reference to the accompanying drawings, wherein like numbers reference like elements.

DESCRIPTION OF EXEMPLARY EMBODIMENTS

Hereinafter, some exemplary embodiments of the disclosure will be described in detail. Note that some exemplary embodiments described below do not unreasonably limit contents of the disclosure described in claims, and all configurations described in some exemplary embodiments do not have to be indispensable matters of the disclosure.

1. Display Driver

Figure 1:
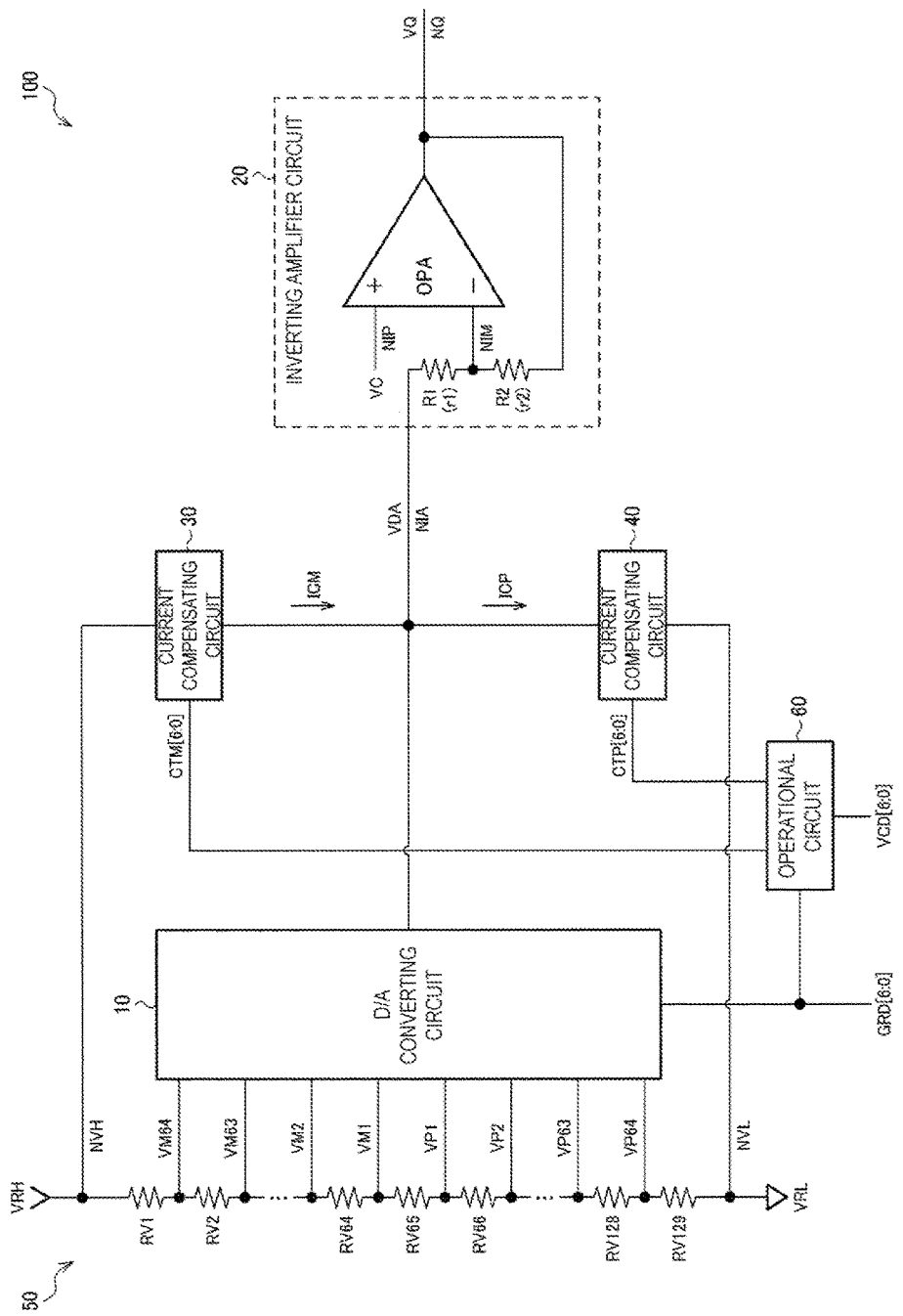
FIG. 1 is a first configuration example of a display driver in one exemplary embodiment.

FIG. 1 is a first configuration example of a display driver 100 in one exemplary embodiment. The display driver 100 includes a digital-to-analog (D/A) converting circuit 10, an inverting amplifier circuit 20, a current compensating circuit 30 (first current compensating circuit), and a current compensating circuit 40 (second current compensating circuit). The display driver 100 may further include a ladder resistance circuit 50 (gradation voltage generating circuit) and an operational circuit 60. Note that the disclosure is not limited to the configuration of FIG. 1, and various modifications can be achieved by, for example, omitting a part of the structural components or adding another structural component.

The D/A converting circuit 10 converts display data GRD [6:0] into a gradation voltage VDA. In other words, the D/A converting circuit 10 selects a voltage corresponding to the display data GRD [6:0] from a plurality of voltages VP1 to VP64 and VM1 to VM64 and outputs the selected voltage as the gradation voltage VDA. Specifically, in a case where GRD [6:0]=0000000, 0000001, . . . , 0111111, respective negative driving voltages VM64, VM63, . . . , VM1 are output as the gradation voltage VDA. In a case where GRD [6:0]=1000000, 1000001, . . . , 1111111, respective positive driving voltages VP1, VP2, VP64 are output as the gradation voltage VDA. Note that GRD [6:0] is expressed in binary herein. In polarity inversion driving that inverts a drive polarity for every pixel, line, or frame, the positive driving voltages VP1 to VP64 are selected for positive driving, and the negative driving voltages VM1 to VM64 are selected for negative driving.

The inverting amplifier circuit 20 includes an operational amplifier OPA (operational amplifier), a resistor R1 (first resistor, first resistance element), and a resistor R2 (second resistor, second resistance element). A reference voltage VC is input to a non-inverting input terminal (positive terminal, non-inverting input node NIP) of the operational amplifier OPA. The resistor R1 is provided between an input node NIA, to which the gradation voltage VDA is input, and an inverting input terminal (negative terminal, inverting input node NIM) of the operational amplifier OPA. The resistor R2 is provided between an output node of the operational amplifier OPA (output node NQ of the inverting amplifier circuit 20) and the inverting input terminal of the operational amplifier OPA. Assuming that the resistors R1 and R2 respectively have resistance values r1 and r2, the inverting amplifier circuit 20 inverts and amplifies the gradation voltage VDA by a gain (−r2/r1) and outputs an output voltage VQ (data voltage). The output voltage VQ is output as a data voltage from a terminal of the display driver 100 and drives a data line (source line) of an electro-optical panel to be coupled to the display driver 100. For example, VP64<VP63< . . . <VP1=VC<VM1<VM2< . . . <VM64. The inversion amplification causes the negative driving voltages VM1 to VM64 to be negative data voltages lower than the reference voltage VC and causes the positive driving voltages VP1 to VP64 to be positive data voltages higher than the reference voltage VC.

The current compensation circuit 30 is provided between the input node NIA of the inverting amplifier circuit 20 and a node NVH of a high electric potential side-power supply voltage, and causes a compensation current ICM (first compensation current) to flow from the node NVH of the high electric potential side-power supply voltage to the input node NIA of the inverting amplifier circuit 20. The current compensation circuit 40 is provided between the input node NIA of the inverting amplifier circuit 20 and a node NVL of a low electric potential side-power supply voltage, and causes a compensation current ICP (second compensation current) to flow from the input node NIA of the inverting amplifier circuit 20 to the node NVL of the low electric potential side-power supply voltage.

A current flows between the input node NIA and the output node NQ of the inverting amplifier circuit 20 through the resistors R1 and R2. In other words, a current of (VQ−VDA)/(r1+r2) (or (VC−VDC)/r1 or (VQ−VC)/r2) flows from the output node NQ to the input node NIA. The compensation currents ICM and ICP serve as currents for compensating the current. In other words, the compensation currents ICM and ICP serve as currents for reducing (or canceling) a current flowing between the input node NIA and the ladder resistance circuit 50 (a voltage node selected by the D/A converting circuit 10) through the D/A converting circuit 10.

According to some exemplary embodiments described above, the current compensating circuit 30 causes the compensation current ICM to flow from the node NVH of the high electric potential side-power supply voltage to the input node NIA of the inverting amplifier circuit 20, and the current compensating circuit 40 causes the compensation current ICP to flow from the input node NIA of the inverting amplifier circuit 20 to the node NVL of the low electric potential side-power supply voltage. Thus, the current flowing between the input node NIA of the inverting amplifier circuit 20 and the ladder resistance circuit 50 through the D/A converting circuit 10 can be compensated. Thus, while the inverting amplifier circuit 20 including the resistors R1 and R2 provided as feedback circuits between the input node NIA and the output node NQ is adopted, an error in the gradation voltage VDA output from the D/A converting circuit 10 can be reduced (or canceled).

Further, since the inverting amplifier circuit 20 is adopted, an operating point of a differential pair of the operational amplifier OPA is limited to the reference voltage VC (a voltage around the reference voltage VC). This eliminates a need to secure sensitivity (gain) of the operational amplifier OPA in a wide range of input voltage, and the operational amplifier OPA can thus be made to be highly sensitive (highly gained). The inverting amplifier circuit 20 including the resistors R1 and R2 provided as feedback circuits between the input node NIA and the output node NQ is adopted. This eliminates a need for initialization unlike an inverting amplifier circuit including a capacitor as a feedback circuit. The inverting amplifier circuit 20 is less likely to be affected by an influence of noise than the inverting amplifier circuit including a capacitor as a feedback circuit. The inverting amplifier circuit 20 is adopted, and thus a frequency response characteristic can be further improved (the band can be broader) than a case where a voltage follower circuit is used for an output of a data voltage. This is because the phase of an output is rotated by 180 degrees with respect to the phase of an input, and therefore, the band that can secure a phase margin is broadened.

Figure 2:
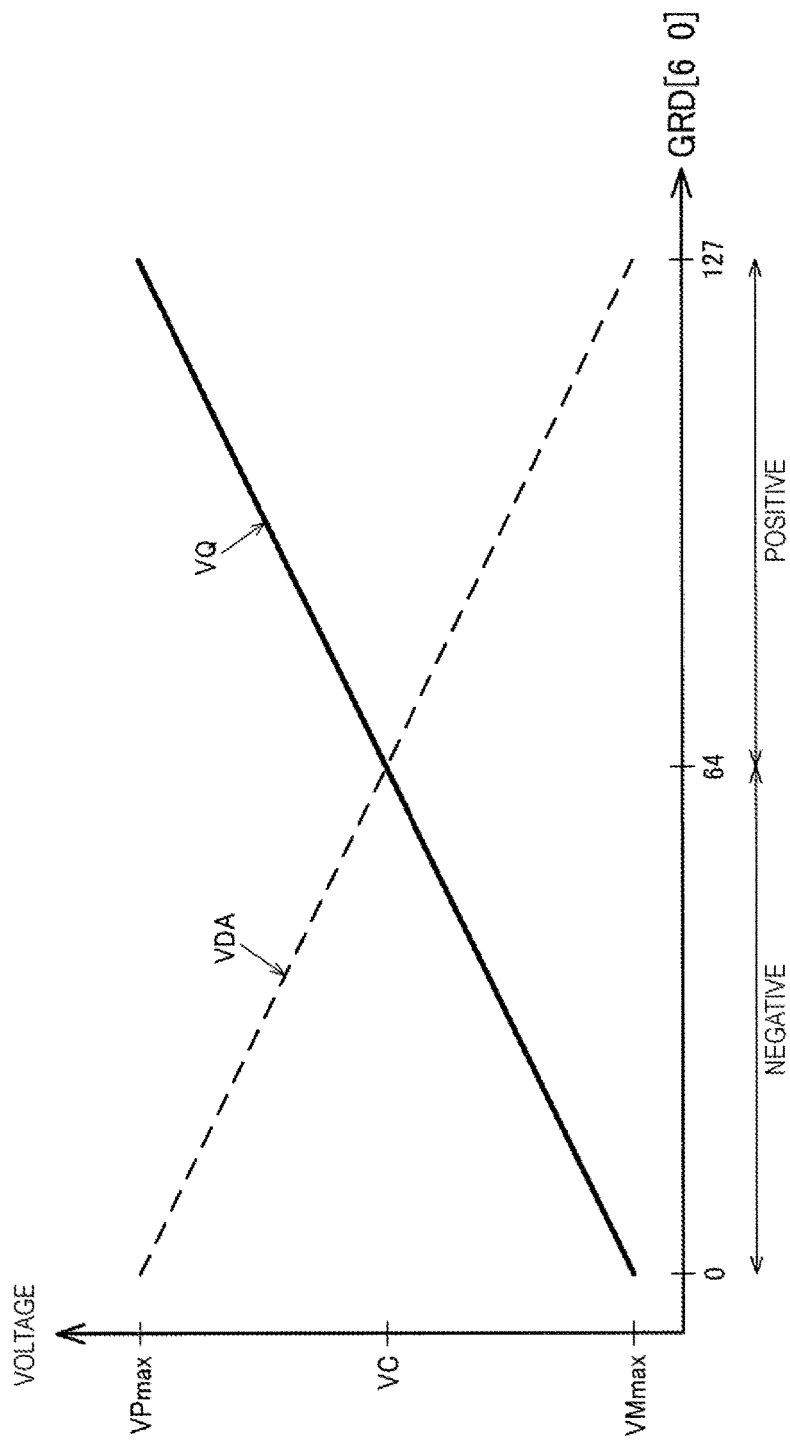
FIG. 2 is a diagram for illustrating an operation of the display driver in one exemplary embodiment.
Figure 3:
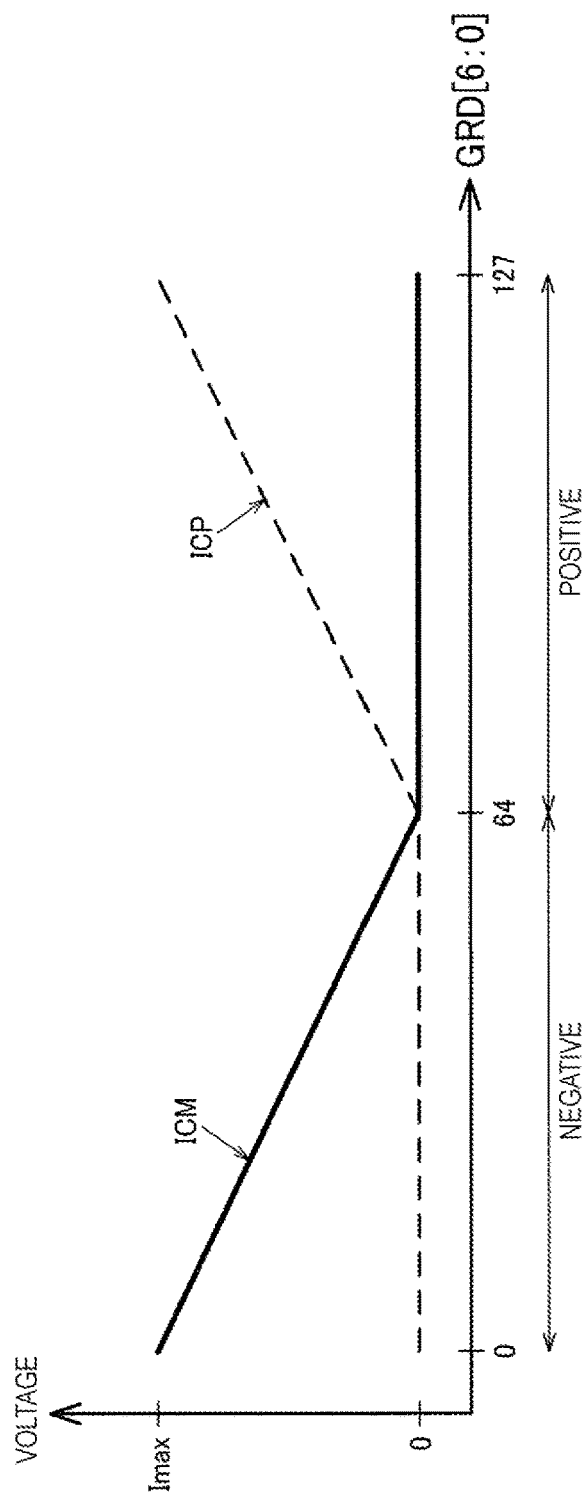
FIG. 3 is a diagram for illustrating an operation of the display driver in one exemplary embodiment.

FIGS. 2 and 3 are diagrams for illustrating an operation of the display driver 100 in one exemplary embodiment. In FIGS. 2 and 3, a gradation value of the display data GRD [6:0] is represented in decimal. In addition, a case where a gain of the inverting amplifier circuit 20 is −1 (namely, r1=r2) will be described as an example. Note that the gain of the inverting amplifier circuit 20 is not limited to −1.

As illustrated in FIG. 2, the gradation voltage VDA changes linearly, for example, with respect to a gradation value of GRD [6:0]. In a case where GRD [6:0]=0, VDA=VPmax. In a case where GRD [6:0]=64, VDA=VC. In a case where GRD [6:0]=127, VDA=VMmax. For a data voltage after inversion amplification, in a case where GRD [6:0]=0, VQ=VMmax. In a case where GRD [6:0]=64, VQ=VC. In a case where GRD [6:0]=127, VQ=VPmax. Thus, VQ<VC<VDA in negative gradations (gradation values "0" to "63"), and VQ≥VC≥VDA in positive gradations (gradation values "64" to "127"). Note that VPmax is a maximum positive gradation voltage and VMmax is a maximum negative gradation voltage (gradation voltage farthest from VC). In addition, (VPmax+VMmax)/2=VC.

As illustrated in FIG. 3, in the negative gradations, the current compensating circuit 30 causes the compensation current ICM to flow from the node NVH of the high electric potential side-power supply voltage to the input node NIA of the inverting amplifier circuit 20. Since VQ<VC<VDA in the negative gradations and a current flows from the input node NIA to the output node NQ of the inverting amplifier circuit 20, at least a part of (the whole or a part of) the current is supplied from the current compensating circuit 30 (absorbed by the current compensating circuit 30). For example, in a case where GRD [6:0]=0, ICM=Imax, and ICM changes linearly (decreases) with respect to a gradation value at GRD [6:0]<64. In a case where GRD [6:0]≥64, ICM=0. Imax is a maximum value of the compensation current. For example, Imax=|(Vmax−VPmax)/(r1+r2)| or Imax=|(VC−VPmax)/r1|.

In the positive gradations, the current compensating circuit 40 causes the compensation current ICP to flow from the input node NIA of the inverting amplifier circuit 20 to the node NVL of the low electric potential side-power supply voltage. Since VQ≥VC≥VDA in the positive gradations and a current flows from the output node NQ to the input node NIA of the inverting amplifier circuit 20, at least a part of (the whole or a part of) the current is absorbed by the current compensating circuit 40. For example, in a case where GRD [6:0]≥64, ICP=0, and ICP changes (increases) linearly with respect to a gradation value at GRD [6:0]≥64. In a case where GRD [6:0]=127, ICP=Imax.

In some exemplary embodiments above, when the output voltage VQ of the inverting amplifier circuit 20 is lower than the reference voltage VC, the current compensating circuit 30 flows the compensation current ICM. In a case where the output voltage VQ of the inverting amplifier circuit 20 is higher than the reference voltage VC, the current compensating circuit 40 flows the compensation current ICP.

In this way, in the negative driving (negative period) in which VQ<VC, at least a part of the current flowing from the input node NIA to the output node NQ of the inverting amplifier circuit 20 can be supplied from the current compensating circuit 30. Further, in the positive gradations (positive period) in which VQ>VC, at least a part of the current flowing from the output node NQ to the input node NIA of the inverting amplifier circuit 20 can be absorbed by the current compensating circuit 40. Thus, the current flowing between the input node NIA of the inverting amplifier circuit 20 and the ladder resistance circuit 50 through the D/A converting circuit 10 can be reduced (compensated).

Also in one exemplary embodiment, in a case where the output voltage VQ of the inverting amplifier circuit 20 is lower than the reference voltage VC, the current compensating circuit 30 causes the compensation current ICM having a current value increased with a greater voltage difference to flow between the output voltage VQ of the inverting amplifier circuit 20 and the reference voltage VC. In a case where the output voltage VQ of the inverting amplifier circuit 20 is higher than the reference voltage VC, the current compensating circuit 40 causes the compensation current ICP having a current value increased with a greater voltage difference to flow between the output voltage VQ of the inverting amplifier circuit 20 and the reference voltage VC.

The current flowing between the output node NQ and the input node NIA of the inverting amplifier circuit 20 has a magnitude of |(VQ−VC)/r2|, and the magnitude of the current increases with a greater voltage difference between the output voltage VQ of the inverting amplifier circuit 20 and the reference voltage VC. Thus, the current flowing between the output node NQ and the input node NIA of the inverting amplifier circuit 20 can be effectively compensated by causing the compensation currents ICM and ICP having a current value increased with a greater voltage difference to flow between the output voltage VQ of the inverting amplifier circuit 20 and the reference voltage VC.

Also in one exemplary embodiment, the operational circuit 60 performs operational processing based on the display data GRD [6:0], and outputs setting data CTM [6:0] (first setting data, first setting signal) for setting a current value of the compensation current ICM and setting data CTP [6:0] (second setting data, second setting signal) for setting a current value of the compensation current ICP. Then, the current compensating circuit 30 outputs the compensation current ICM having a current value set by the setting data CTM [6:0]. The current compensating circuit 40 outputs the compensation current ICP having a current value set by the setting data CTP [6:0].

The operational processing is processing for obtaining the setting data CTM [6:0] and CTP [6:0] from the display data GRD [6:0], and is processing for obtaining the setting data CTM [6:0] and CTP [6:0] by a computation corresponding to an operational expression including the display data GRD [6:0]. The operational circuit 60 is realized by a logic circuit. Note that the operational circuit 60 may be realized by a digital signal processor (DSP) that executes a plurality of digital signal processing in a time-division manner. In this case, the operational processing is executed in the time-division manner together with another digital signal processing.

According to one exemplary embodiment, the operational circuit 60 obtains the setting data CTM [6:0] and CTP [6:0] based on the display data GRD [6:0], and thus the compensation currents ICM and ICP having a current value corresponding to a gradation value of the display data GRD [6:0] (namely, the output voltage VQ of the inverting amplifier circuit 20) can be output.

Also in one exemplary embodiment, the operational circuit 60 outputs the setting data CTM [6:0] for increasing a current value of the compensation current ICM with a greater difference between a gradation value of the display data GRD [6:0] and a gradation value corresponding to the reference voltage VC in the positive period of the polarity inversion driving. The operational circuit 60 outputs the setting data CTP [6:0] for increasing a current value of the compensation current ICP with a greater difference between a gradation value of the display data GRD [6:0] and a gradation value corresponding to the reference voltage VC in the negative period of the polarity inversion driving.

Specifically, it is assumed that data of a gradation value corresponding to the reference voltage VC is reference data VCD [6:0]. The reference data VCD [6:0] is identical to the display data GRD [6:0] for causing an output voltage of the inverting amplifier circuit 20 to be VQ=VC (causing an output voltage of the D/A converting circuit 10 to be VDA=VC). For example, VCD [6:0]=0100000 (gradation value "64"). The operational circuit 60 outputs the setting data CTM [6:0] and CTP [6:0] based on a difference between the display data GRD [6:0] and the reference data VCD [6:0]. For example, it is assumed that current values of the compensation currents ICM and ICP are increased with a greater value of the setting data CTM [6:0] and CTP [6:0]. In this case, values of the setting data CTM [6:0] and CTP [6:0] are increased with a greater difference (greater magnitude of a difference) between the display data GRD [6:0] and the reference data VCD [6:0]. Note that the reference data VCD [6:0] may be, for example, set by register writing from the outside of the display driver 100, input from a control circuit (for example, a control circuit 180 in FIG. 12) of the display driver 100 to the operational circuit 60, or incorporated as a fix value into the operational circuit 60.

According to one exemplary embodiment, the setting data CTM [6:0] and CTP [6:0] for increasing a current value of the compensation currents ICM and ICP are output with a greater difference between a gradation value of the display data GRD [6:0] and a gradation value corresponding to the reference voltage VC, and thus the compensation currents ICM and ICP having a current value increased with a greater voltage difference flow between the output voltage VQ of the inverting amplifier circuit 20 and the reference voltage VC.

Also in one exemplary embodiment, the ladder resistance circuit 50 generates the plurality of voltages VP1 to VP64 and VM1 to VM64. Then, the D/A converting circuit 10 selects a voltage corresponding to the display data GRD [6:0] from the plurality of voltages VP1 to VP64 and VM1 to VM64 and outputs the voltage as the gradation voltage VDA.

Specifically, the ladder resistance circuit 50 includes resistors RV1 to RV129 (resistance elements) coupled in series. The high electric potential side-power supply voltage VRH is input to one end on the resistor RV1 side of the resistors RV1 to RV129 coupled in series, and the low electric potential side-power supply voltage VRL is input to the other end on the resistor RV129 side. The voltages VP1 to VP64 and VM1 to VM64 are each output from a node (tap) between a resistor and a resistor of the ladder resistance circuit 50. In other words, the voltage VM64 is output from the node between the resistor RV1 and the resistor RV2, the voltage VM63 is output from the node between the resistor RV2 and the resistor RV3, and the voltage VM1 is output from the node between the resistor RV64 and the resistor RV65. The voltage VP1 is output from the node between the resistor RV65 and the resistor RV66, the voltage VP2 is output from the node between the resistor RV66 and the resistor RV67, and the voltage VP64 is output from the node between the resistor RV128 and the resistor RV129. For example, the resistors RV2 to RV128 have the same resistance value. Note that the disclosure is not limited to this, and, for example, the resistors RV2 to RV65 may each have a resistance value corresponding to a gamma characteristic of the negative driving, and the resistors RV66 to RV128 may each have a resistance value corresponding to a gamma characteristic of the positive driving.

A voltage value of the gradation voltage VDA is determined by resistance division of the ladder resistance circuit 50. Thus, when a current flows between the input node NIA of the inverting amplifier circuit 20 and the ladder resistance circuit 50 through the D/A converting circuit 10, an error occurs in the gradation voltage VDA. For example, in a case where the voltage VM 64 is selected as the gradation voltage VDA, a current flows from the node between the resistor RV1 and the resistor RV2 to the input node NIA of the inverting amplifier circuit 20. Then, a current flowing through the resistors RV2 to RV129 decreases, and an error occurs in a direction in which the voltage VM64 is lowered. Alternatively, in a case where the voltage VP63 is selected as the gradation voltage VDA, a current flows from the input node NIA of the inverting amplifier circuit 20 to the node between the resistor RV127 and the resistor RV128. Then, a current flowing through the resistors RV128 and RV129 increases, and an error occurs in a direction in which the voltage VP63 rises.

According to one exemplary embodiment, the current compensating circuits 30 and 40 causes the compensation currents ICM and ICP to flow, and the current flowing between the input node NIA of the inverting amplifier circuit 20 and the ladder resistance circuit 50 through the D/A converting circuit 10 can be reduced. Thus, while the inverting amplifier circuit 20 including the resistors R1 and R2 provided as feedback circuits between the input node NIA and the output node NQ is adopted, an error in the gradation voltage VDA output from the D/A converting circuit 10 can be reduced (or canceled).

Note that the case where the display data GRD [6:0] can indicate both gradations in the positive driving and gradations in the negative driving is described above as an example, but the configuration of the display data GRD [6:0] is not limited to this. For example, display data may indicate simple gradations that do not include information about polarity, and a polarity signal for controlling driving polarity may be provided separately. In this case, the D/A converting circuit 10 may select a gradation voltage from a plurality of voltages based on the display data and the polarity signal. A gradation value corresponding to the reference voltage VC is, for example, zero, and thus the operational circuit 60 may generate setting data for a compensation current from the display data instead of a difference between the display data and the reference data. At this time, which of the compensation current ICM or ICP to be output may be controlled based on the polarity signal.

2. Operational Circuit and Current Compensating Circuit

Figure 4:
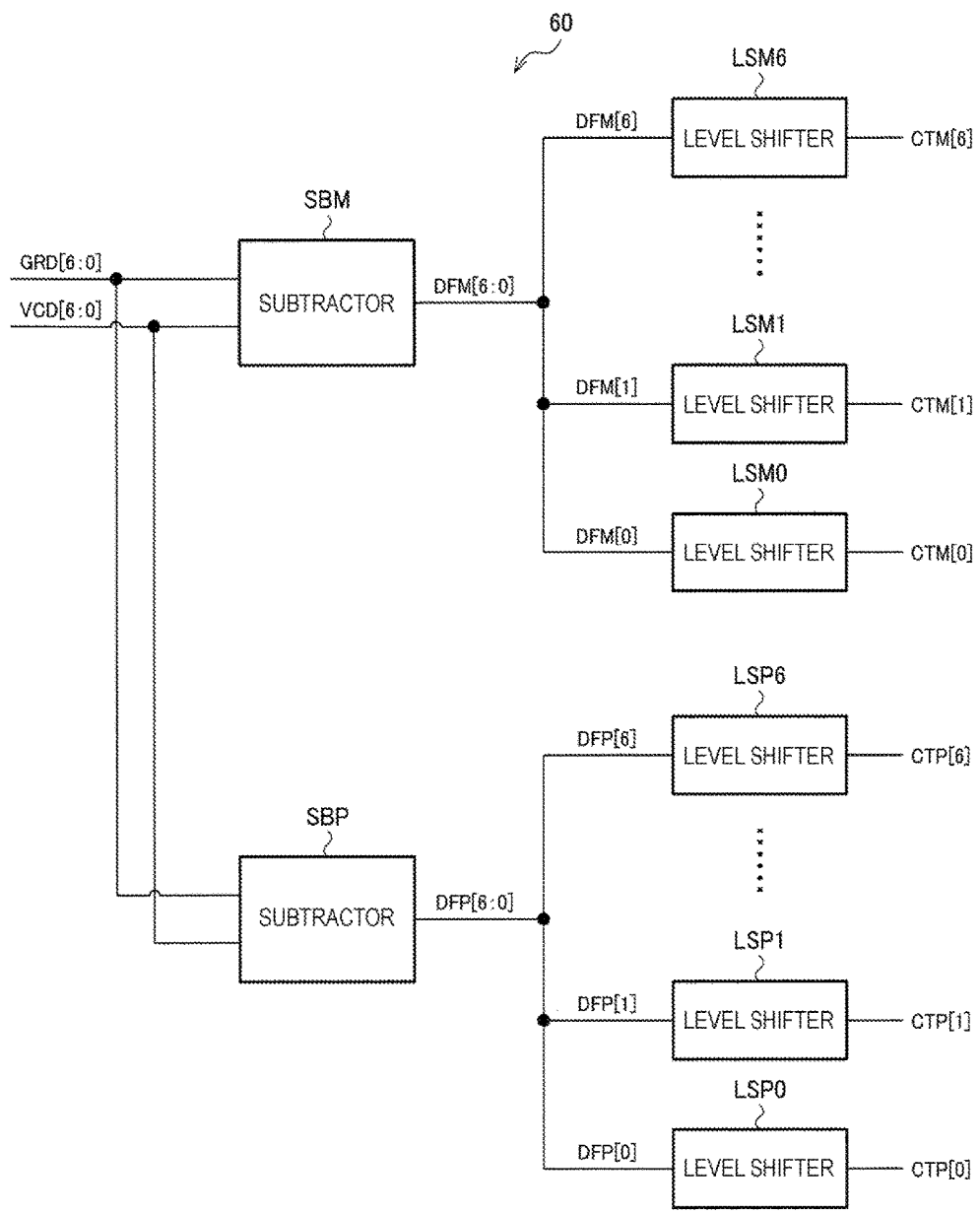
FIG. 4 is a detailed configuration example of an operational circuit.

FIG. 4 is a detailed configuration example of the operational circuit 60. The operational circuit 60 includes a subtractor SBM, a subtractor SBP, level shifters LSM0 to LSM6, and level shifters LSP0 to LSP6.

The subtractor SBM subtracts the negative display data GRD [6:0] and the reference data VCD [6:0] and outputs difference data DFM [6:0]. The subtractor SBP subtracts the positive display data GRD [6:0] and the reference data VCD [6:0] and outputs difference data DFP [6:0]. Specifically, the subtractor SBM outputs DFM [6:0]=GRD [6:0]−VCD [6:0] in a case where GRD [6:0]−VCD [6:0]<0, and outputs DFM [6:0]=1111111 in a case where GRD [6:0]−VCD [6:0]≥0. The subtractor SBP outputs DFM [6:0]=GRD [6:0]−VCD [6:0] in a case where GRD [6:0]−VCD [6:0]≥0, and outputs DFM [6:0]=0000000 in a case where GRD [6:0]−VCD [6:0]<0.

The level shifters LSM0 to LSM6 and LSP0 to LSP6 are circuits for performing a level shift between a power supply voltage of a logic circuit and a power supply voltage (VRH and VRL) of the current compensating circuits 30 and 40. In other words, the level shifter LSM0 shifts a signal level of DFM [0] and outputs CTM [0]. Similarly, the level shifters LSM1 to LSM6 respectively shift signal levels of DFM [1] to DFM [6] and output CTM [1] to CTM [6]. The level shifter LSP0 shifts a signal level of DFP [0] and outputs CTP [0]. Similarly, the level shifters LSP1 to LSP6 respectively shift signal levels of DFP [1] to DFP [6] and output CTP [1] to CTP [6].

Figure 5:
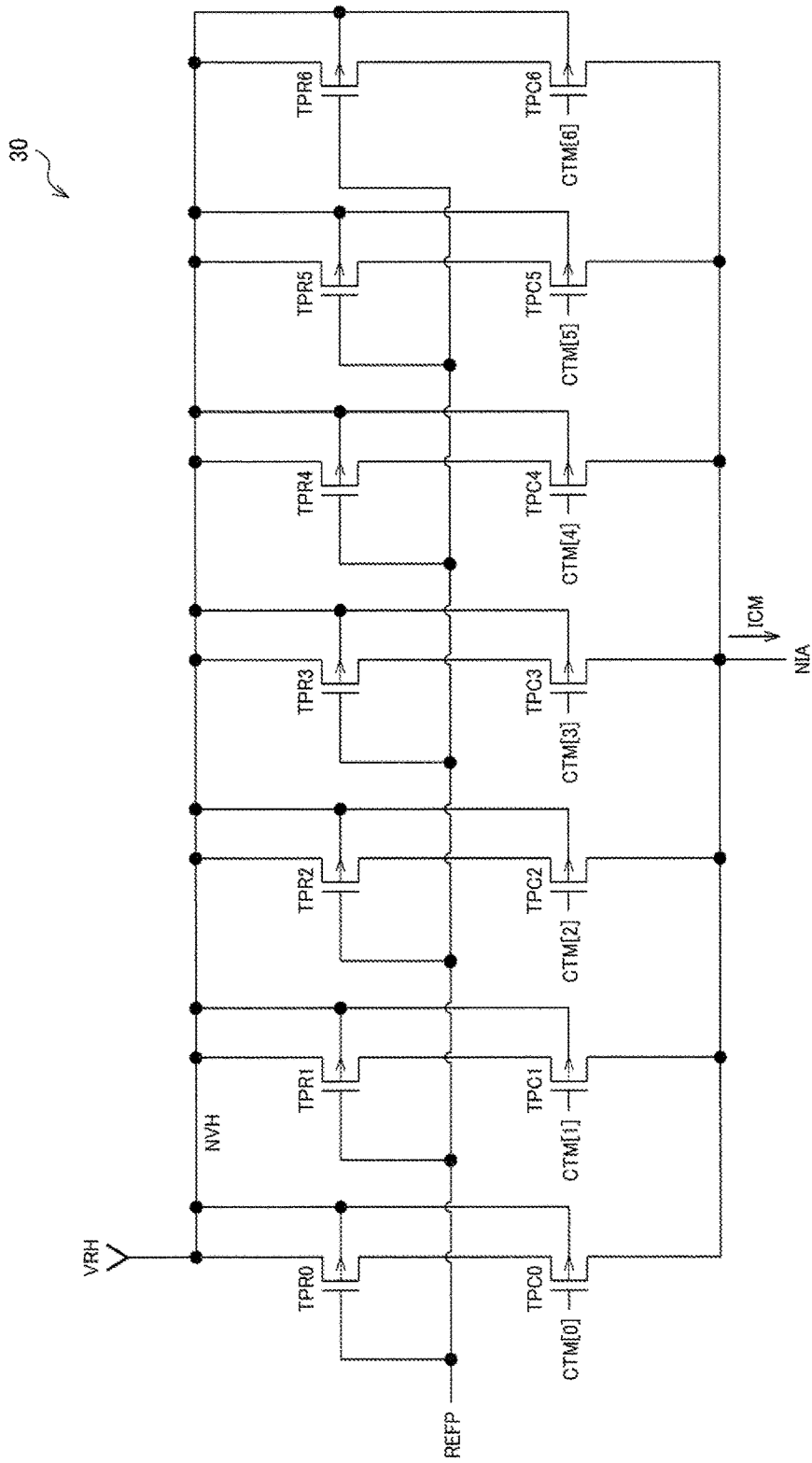
FIG. 5 is a detailed configuration example of a current compensating circuit.

FIG. 5 is a detailed configuration example of the current compensating circuit 30. The current compensating circuit 30 includes P-type transistors TPR0 to TPR6 and P-type transistors TPC0 to TPC6.

The P-type transistor TPR0 and the P-type transistor TPC0 are coupled to each other in series between the node NVH of the high electric potential side-power supply voltage and the input node NIA of the inverting amplifier circuit 20. A bit signal CTM [0] of the setting data CTM [6:0] is input to a gate of the P-type transistor TPC0. Similarly, the P-type transistors TPR1 to TPR6 and the P-type transistors TPC1 to TPC6 are respectively coupled to each other in series between the node NVH of the high electric potential side-power supply voltage and the input node NIA of the inverting amplifier circuit 20. Bit signals CTM [1] to CTM [6] are respectively input to gates of the P-type transistors TPC1 to TPC6. A bias voltage REFP for setting a drain current of the P-type transistors TPR0 to TPR6 is input to gates of the P-type transistors TPR0 to TPR6. The drain current of the P-type transistors TPR0 to TPR6 is set such that its ratio is a power of 2 (binary). In other words, the size of a P-type transistor TPRk (where k is an integer of one or more and six or less) is 2 k times the size of the P-type transistor TPR0, and the size of a P-type transistor TPCk is 2 k times the size of the P-type transistor TPC0. Note that the transistor size may be set by, for example, W/L (where W is a channel width and L is a channel length) of a transistor or the number (namely, a total size) of unit transistors.

As described above, since CTM [6:0] (DFM [6:0])=1111111 GRD [6:0]−VCD [6:0]≥0, all of the P-type transistors TPC0 to TPC6 are off in the positive driving, and the compensation current ICM has a current value of 0. Since CTM [6:0]=GRD [6:0]−VCD [6:0]GRD [6:0]VCD [6:0]<0, on and off of the P-type transistors TPC0 to TPC6 are controlled according to CTM [6:0] in the negative driving. Thus, the compensation current ICM has a current value in proportion to a difference (magnitude of a difference) between the display data GRD [6:0] and the reference data VCD [6:0].

Figure 6:
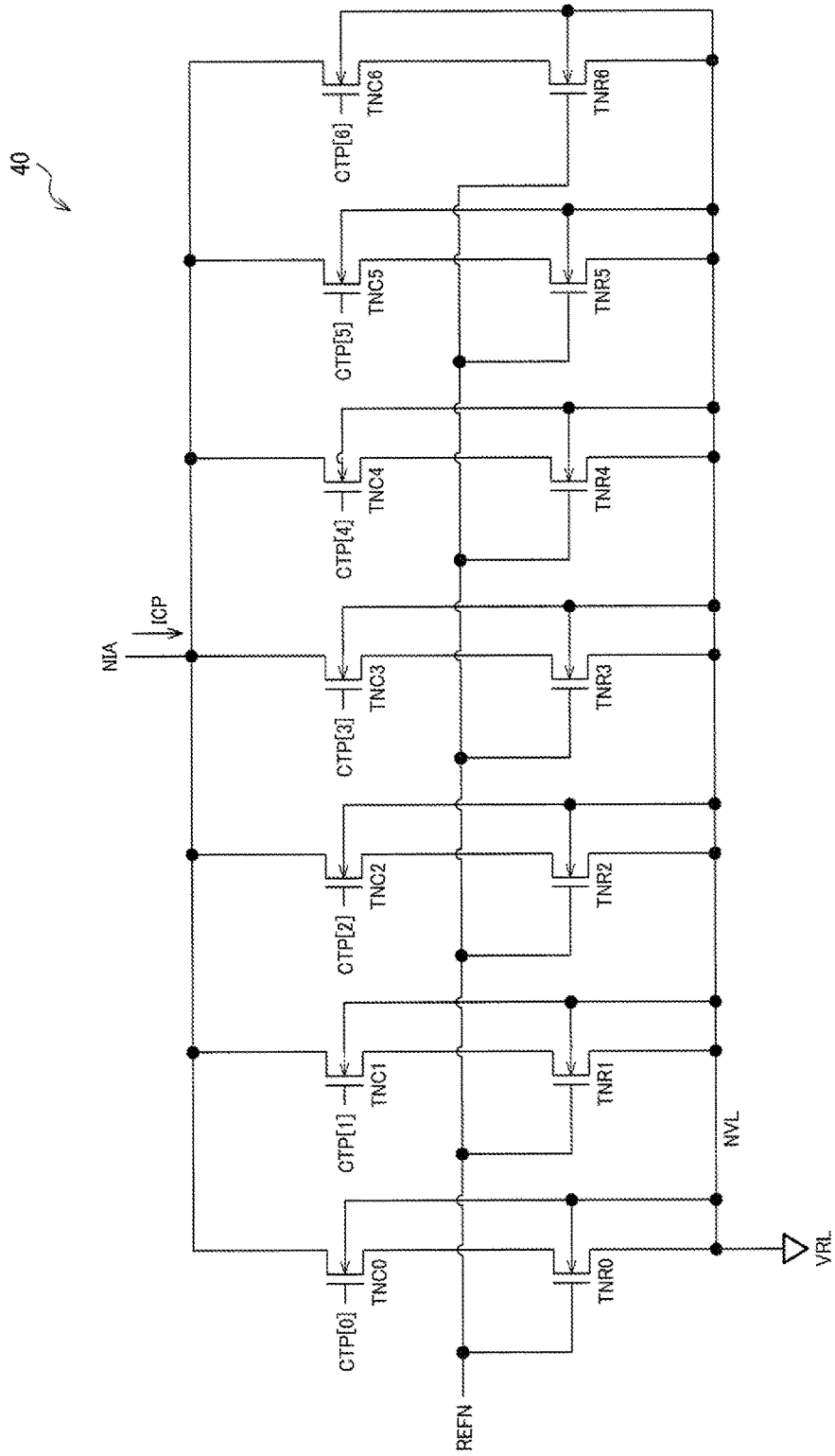
FIG. 6 is a detailed configuration example of a current compensating circuit.

FIG. 6 is a detailed configuration example of the current compensating circuit 40. The current compensating circuit 40 includes N-type transistors TNR0 to TNR6 and N-type transistors TNC0 to TNC6.

The N-type transistor TNR0 and the N-type transistor TNC0 are coupled to each other in series between the node NVL of the low electric potential side-power supply voltage and the input node NIA of the inverting amplifier circuit 20. A bit signal CTP [0] of the setting data CTP [6:0] is input to a gate of the N-type transistor TNC0. Similarly, the N-type transistors TNR1 to TNR6 and the N-type transistors TNC1 to TNC6 are respectively coupled to each other in series between the node NVL of the low electric potential side-power supply voltage and the input node NIA of the inverting amplifier circuit 20. Bit signals CTP [1] to CTP [6] are respectively input to gates of the N-type transistors TNC1 to TNC6. A bias voltage REFN for setting a drain current of the N-type transistors TNR0 to TNR6 is input to gates of the N-type transistors TNR0 to TNR6. The drain current of the N-type transistors TNR0 to TNR6 is set such that its ratio is a power of 2 (binary). In other words, the size of an N-type transistor TNRk is 2 k times the size of the N-type transistor TNR0, and the size of an N-type transistor TNCk is 2 k times the size of the N-type transistor TNC0.

Note that the transistor size may be set by, for example, W/L (where W is a channel width and L is a channel length) of a transistor or the number (namely, a total size) of unit transistors.

As described above, since CTP [6:0] (DFP [6:0])=0000000 in a case where GRD [6:0]−VCD [6:0]<0, all of the N-type transistors TNC0 to TNC6 are off in the negative driving, and the compensation current ICP has a current value of 0. Since CTP [6:0]=GRD [6:0]−VCD [6:0] in a case where GRD [6:0]−VCD [6:0]≥0, on and off of the N-type transistors TNC0 to TNC6 are controlled according to CTP [6:0] in the positive driving. Thus, the compensation current ICP has a current value in proportion to a difference (magnitude of a difference) between the display data GRD [6:0] and the reference data VCD [6:0].

3. Operational Amplifier

Figure 7:
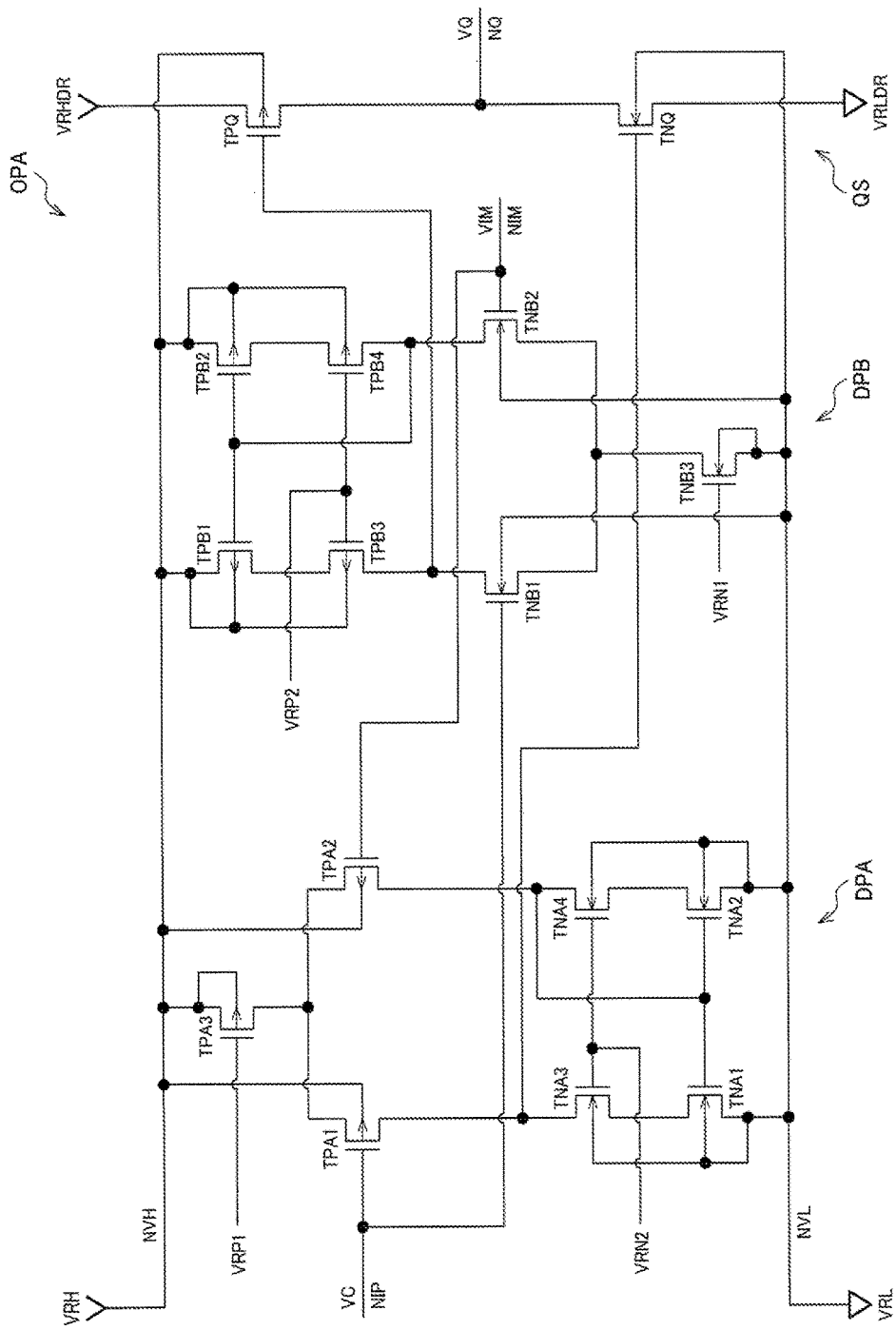
FIG. 7 is a detailed configuration example of an operational amplifier.

FIG. 7 is a detailed configuration example of the operational amplifier OPA. The operational amplifier OPA includes a differential pair unit DPA, a differential pair unit DPB, and an output unit QS.

The differential pair unit DPA includes P-type transistors TPA1 to TPA3 and N-type transistors TNA1 to TNA4. Sources of TPA1 and TPA2 forming a differential pair are coupled to a drain of TPA3. A gate of TPA1 is coupled to the non-inverting input terminal (NIP). A gate of TPA2 is coupled to the inverting input terminal (NIM). The high electric potential side-power supply voltage VRH is input to a source of TPA3, and a bias voltage VRP1 is input to a gate of TPA3. The low electric potential side-power supply voltage VRL is input to sources of TNA1 and TNA2 forming a current mirror circuit, and gates of TNA1 and TNA2 are both coupled to a drain of TPA2. A source of TNA3 is coupled to a drain of TNA1, and a drain of TNA3 is coupled to a drain of TPA1. A source of TNA4 is coupled to a drain of TNA2, and a drain of TNA4 is coupled to a drain of TPA2. A bias voltage VRN2 is input to gates of TNA3 and TNA4.

The differential pair unit DPB includes P-type transistors TPB1 to TPB4 and N-type transistors TNB1 to TNB3. Sources of TNB1 and TNB2 forming a differential pair are coupled to a drain of TNB3. A gate of TNB1 is coupled to the non-inverting input terminal (NIP). A gate of TNB2 is coupled to the inverting input terminal (NIM). The low electric potential side-power supply voltage VRL is input to a source of TNB3, and a bias voltage VRN1 is input to a gate of TNB3. The high electric potential side-power supply voltage VRH is input to sources of TPB1 and TPB2 forming a current mirror circuit, and gates of TPB1 and TPB2 are both coupled to a drain of TNB2. A source of TPB3 is coupled to a drain of TPB1, and a drain of TPB3 is coupled to a drain of TNB1. A source of TPB4 is coupled to a drain of TPB2, and a drain of TPB4 is coupled to a drain of TNB2. A bias voltage VRP2 is input to gates of TPB3 and TPB4.

The output unit QS includes a P-type transistor TPQ and an N-type transistor TNQ. A driving high electric potential side-power supply voltage VRHDR is input to a source of TPQ. A drain of TPQ is coupled to the output terminal (NQ). The drain of TNB1 of the differential pair unit DPB is coupled to a gate of TPQ. A driving low electric potential side-power supply voltage VRLDR is input to a source of TNQ. A drain of TNQ is coupled to the output terminal (NQ). The drain of TPA1 of the differential pair unit DPA is coupled to a gate of TNQ.

Note that the configuration of the differential pair units DPA and DPB is not limited to the above-described configuration. For example, in the differential pair unit DPA, both of the gates of TNA1 and TNA2 may be coupled to the drain of TNA1, and both of the gates of TNA3 and TNA4 may be coupled to the drain of TNA4. Similarly, in the differential pair unit DPB, both of the gates of TPB1 and TPB2 may be coupled to the drain of TPB1, and both of the gates of TPB3 and TPB4 may be coupled to the drain of TPB4. Alternatively, in the differential pair unit DPA, an N-type transistor (referred to as TNA5) may be provided between the source of TNA1 and the node NVL, an N-type transistor (referred to as TNA6) may be provided between the source of TNA2 and the node NVL, and both of the gates of TNA5 and TNA6 may be coupled to the drain of TNA5. Similarly, in the differential pair unit DPB, a P-type transistor (referred to as TPB5) may be provided between the source of TPB1 and the node NVH, a P-type transistor (referred to as TPB6) may be provided between the source of TPB2 and the node NVH, and both of the gates of TPB5 and TPB6 may be coupled to the drain of TPB5.

In some exemplary embodiments above, the P-type transistor TPA1 (first transistor) and the P-type transistor TPA2 (second transistor) form a differential pair. The N-type transistor TNA1 (third transistor) and the N-type transistor TNA2 (fourth transistor) form a current mirror circuit. The N-type transistor TNA3 (fifth transistor) is provided between TPA1 and TNA1 and includes the gate to which a given bias voltage VRN2 is input. The N-type transistor TNA4 (sixth transistor) is provided between TPA2 and TNA2 and includes the gate to which the given bias voltage VRN2 is input.

In this way, sensitivity (gain) of the operational amplifier OPA is extremely increased in the vicinity of an operating point (reference voltage VC) of a differential pair. In other words, a change in drain voltage of TPA1 with respect to a change in differential input (voltage difference between NIP and NIM) is extremely increased by TNA3 and TNA4, and as a result, sensitivity (gain) of the operational amplifier OPA is extremely increased. In one exemplary embodiment, since an operating point of a differential pair is the reference voltage VC (voltage in the vicinity of the reference voltage VC), an operational amplifier having a configuration with high sensitivity near the operating point of such a differential pair can be adopted. Thus, the operational amplifier OPA becomes an ideal operational amplifier, and an error in the output voltage VQ of the inverting amplifier circuit 20 can be reduced (data voltage can achieve enhanced precision).

4. D/A Converting Circuit

Figure 8:
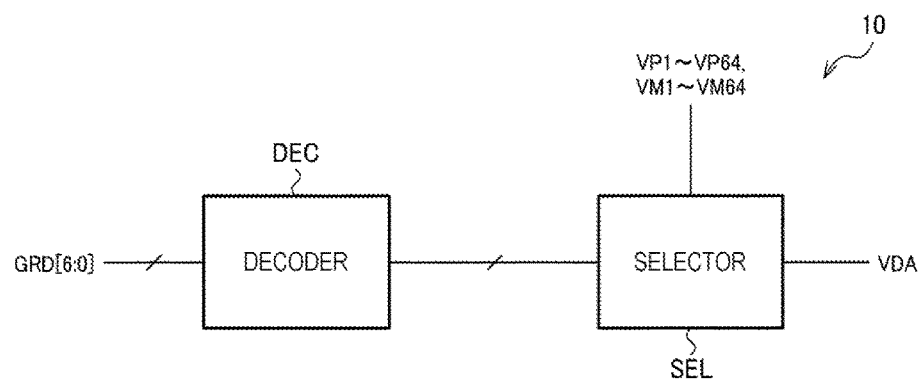
FIG. 8 is a detailed configuration example of a D/A converting circuit.

FIG. 8 is a detailed configuration example of the D/A converting circuit 10. The D/A converting circuit 10 includes a decoder DEC and a selector SEL.

The decoder DEC decodes the display data GRD [6:0] and outputs a selection signal to the selector SEL. The selector SEL selects a voltage corresponding to the display data GRD [6:0] from the plurality of voltages VP1 to VP64 and VM1 to VM64 as the gradation voltage VDA based on the selection signal from the decoder DEC.

Figure 9:
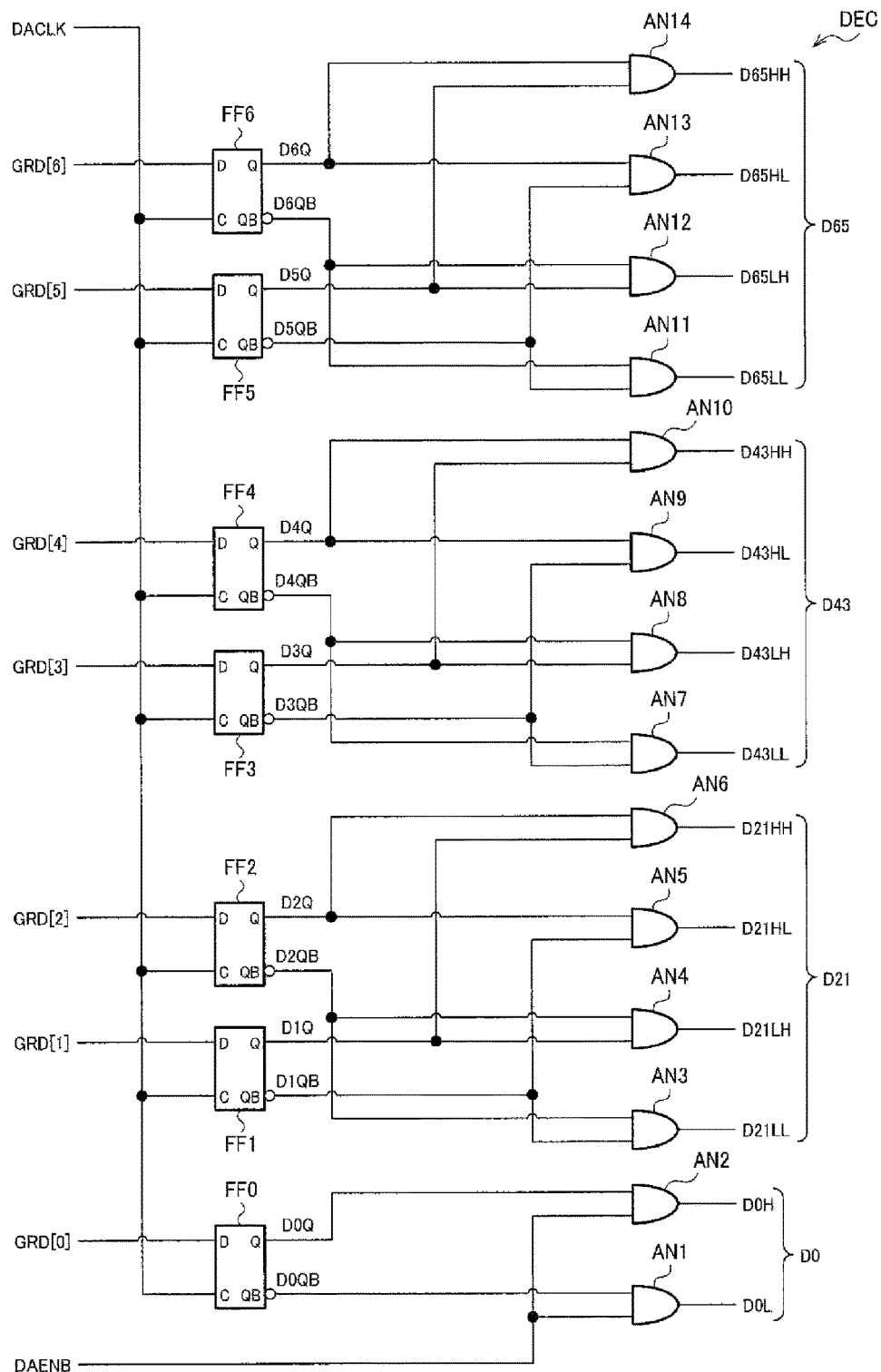
FIG. 9 is a detailed configuration example of a decoder.

FIG. 9 is a detailed configuration example of the decoder DEC. The decoder DEC includes flip-flop circuits FF0 to FF6 (latching circuits) and AND circuits AN1 to AN14.

The flip-flop circuit FF0 latches GRD [0] at an edge (for example, a rising edge) of a clock signal DACLK and then outputs a latched signal D0Q. The flip-flop circuit FF0 also outputs a signal D0QB generated by logically inverting the signal D0Q. Similarly, the flip-flop circuits FF1 to FF6 respectively latch GRD [1] to GRD [6] at the edge of the clock signal DACLK and then output latched signals D1Q to D6Q. The flip-flop circuits FF1 to FF6 also respectively output signals D1QB to D6QB generated by logically inverting the signals D1Q to D6Q. The clock signal DACLK is input from, for example, a control circuit (control circuit 180 in FIG. 12) of the display driver 100.

The AND circuit AN1 outputs an AND of the signal D0QB and an enable signal DAENB as a signal D0L. The AND circuit AN2 outputs an AND of the signal D0Q and the enable signal DAENB as a signal D0H. In a case where DAENB=1, in a case where GRD [0]=0 and 1, the signals D0L and D0H are both 1. Only one of the signals D0L and D0H is 1 and the other is 0. In a case where DAENB=0, the signals D0L and D0H are both 0. Hereinafter, the signals D0L and D0H are referred to as a signal group D0. The enable signal DAENB is input from, for example, a control circuit (control circuit 180 in FIG. 12) of the display driver 100.

The AND circuit AN3 outputs an AND of the signal D2QB and the signal D1QB as a signal D21LL. Similarly, the AND circuits AN4, AN5, and AN6 respectively output an AND of the signal D2QB and the signal D1Q, an AND of the signal D2Q and the signal D1QB, and an AND of the signal D2Q and the signal D1Q as signals D21LH, D21HL, and D21HH. In a case where (GRD [2], GRD [1])=(0, 0), (0, 1), (1, 0), and (1, 1), the signals D21LL, D21LH, D21HL, and D21HH are all 1. Only one of the signals D21LL, D21LH, D21HL, and D21HH is 1, and other three are 0.

Hereinafter, the signals D21LL, D21LH, D21HL, and D21HH are referred to as a signal group D21.

The AND circuit AN7 outputs, as a signal D43LL, an AND of the signal D4QB and the signal D3QB. Similarly, the AND circuits AN8, AN9, and AN10 respectively output an AND of the signal D4QB and the signal D3Q, an AND of the signal D4Q and the signal D3QB, and an AND of the signal D4Q and the signal D3Q as signals D43LH, D43HL, and D43HH. In a case where (GRD [4], GRD [3])=(0, 0), (0, 1), (1, 0), and (1, 1), the signals D43LL, D43LH, D43HL, and D43HH are all 1. Only one of the signals D43LL, D43LH, D43HL, and D43HH is 1, and other three are 0. Hereinafter, the signals D43LL, D43LH, D43HL, and D43HH are referred to as a signal group D43.

The AND circuit AN11 outputs, as a signal D65LL, an AND of the signal D6QB and the signal D5QB. Similarly, the AND circuits AN12, AN13, and AN14 respectively output an AND of the signal D6QB and the signal D5Q, an AND of the signal D6Q and the signal D5QB, and an AND of the signal D6Q and the signal D5Q as signals D65LH, D65HL, and D65HH. In a case where (GRD [6], GRD [5])=(0, 0), (0, 1), (1, 0), and (1, 1), the signals D65LL, D65LH, D65HL, and D65HH are all 1. Only one of the signals D65LL, D65LH, D65HL, and D65HH is 1, and other three are 0. Hereinafter, the signals D65LL, D65LH, D65HL, and D65HH are referred to as a signal group D65.

Note that the decoder DEC includes a level shifter that shifts a signal level of the signal groups D0, D21, D43, and D65, which is not illustrated in FIG. 9. The level shifter is a circuit for performing a level shift between a power supply voltage of a logic circuit and a power supply voltage (VRH and VRL) of the selector SEL.

Figure 10:
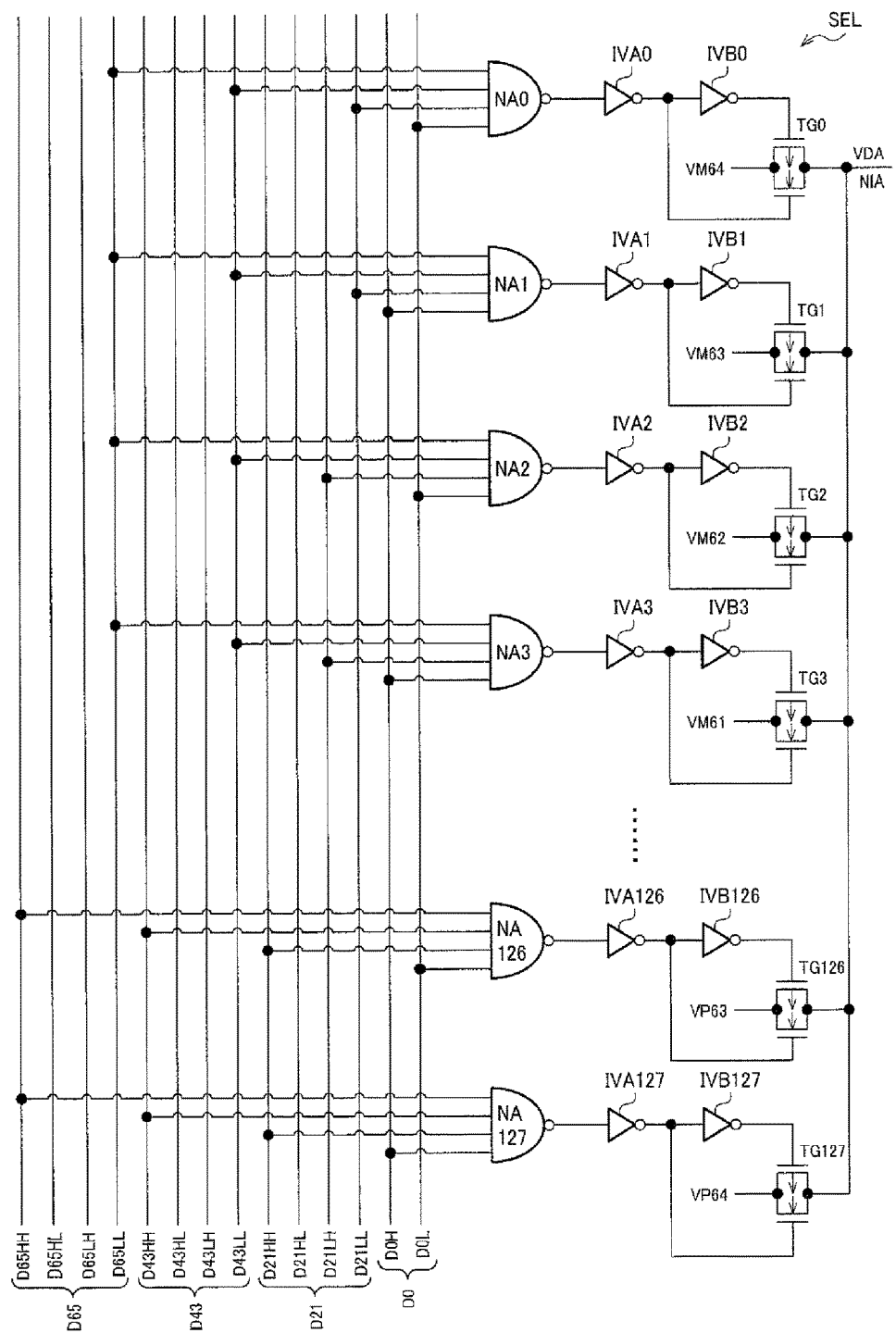
FIG. 10 is a detailed configuration of a selector.

FIG. 10 is a detailed configuration of the selector SEL. The selector SEL includes NAND circuits NA0 to NA127, inverters IVA0 to IVA127, inverters IVB0 to IVB127, and transfer gates TG0 to TG127 (switches).

The NAND circuit NA0 outputs a NAND of the signal D0L of the signal group D0, the signal D21LL of the signal group D21, the signal D43LL of the signal group D43, and the signal D65LL of the signal group D65 as a signal SB0. In a case where GRD [6:0]=0000000 (gradation value "0"), SB0=0. Similarly, the NAND circuits NA1 to NA127 respectively output, as signals SB1 to SB127, NANDs of any signal of the signal group D0, any signal of the signal group D21, any signal of the signal group D43, and any signal of the signal group D65. In a case where GRD [6:0]=0000001 (gradation value "1"), 0000010 (gradation value "2"), . . . , 1111111 (gradation value "127"), SB1, SB2, . . . , SB127 are 0, respectively. Only one of SB0 to SB127 is 0 according to a gradation value of GRD [6:0], and other 127 are 1. Note that in a case where the enable signal DAENB=0, D0L=D0H=0. Hence, SB0 to SB127 are all 1.

On and off of the transfer gate TG0 are controlled by the signal SB0 through the inverters IVA0 and IVB0. The transfer gate TG0 turns on in a case where SB0=0 and turns off in a case where SB0=1. Thus, in a case where SB0=0 (gradation value "0"), the voltage VM64 is output as the gradation voltage VDA. Similarly, on and off of the transfer gates TG1 to TG127 are controlled by the signals SB1 to SB127 through the inverters IVA1 to IVA127 and IVB1 to IVB127, respectively. The transfer gates TG1 to TG127 turn on in a case where SB1 to SB127 are 0 and turn off in a case where SB1 to SB127 are 1, respectively. Thus, in a case where SB1, SB2, . . . , SB63 are 0 (gradation values "1", "2", . . . , "63"), the respective voltages VM63, VM62, . . . , VM1 are output as the gradation voltage VDA. In a case where SB64, SB65, . . . , SB127 are 0 (gradation values "64", "65", . . . , "127"), the respective voltages VP1, VP2, . . . , VP64 are output as the gradation voltage VDA.

5. Second Configuration Example of Display Driver

Figure 11:
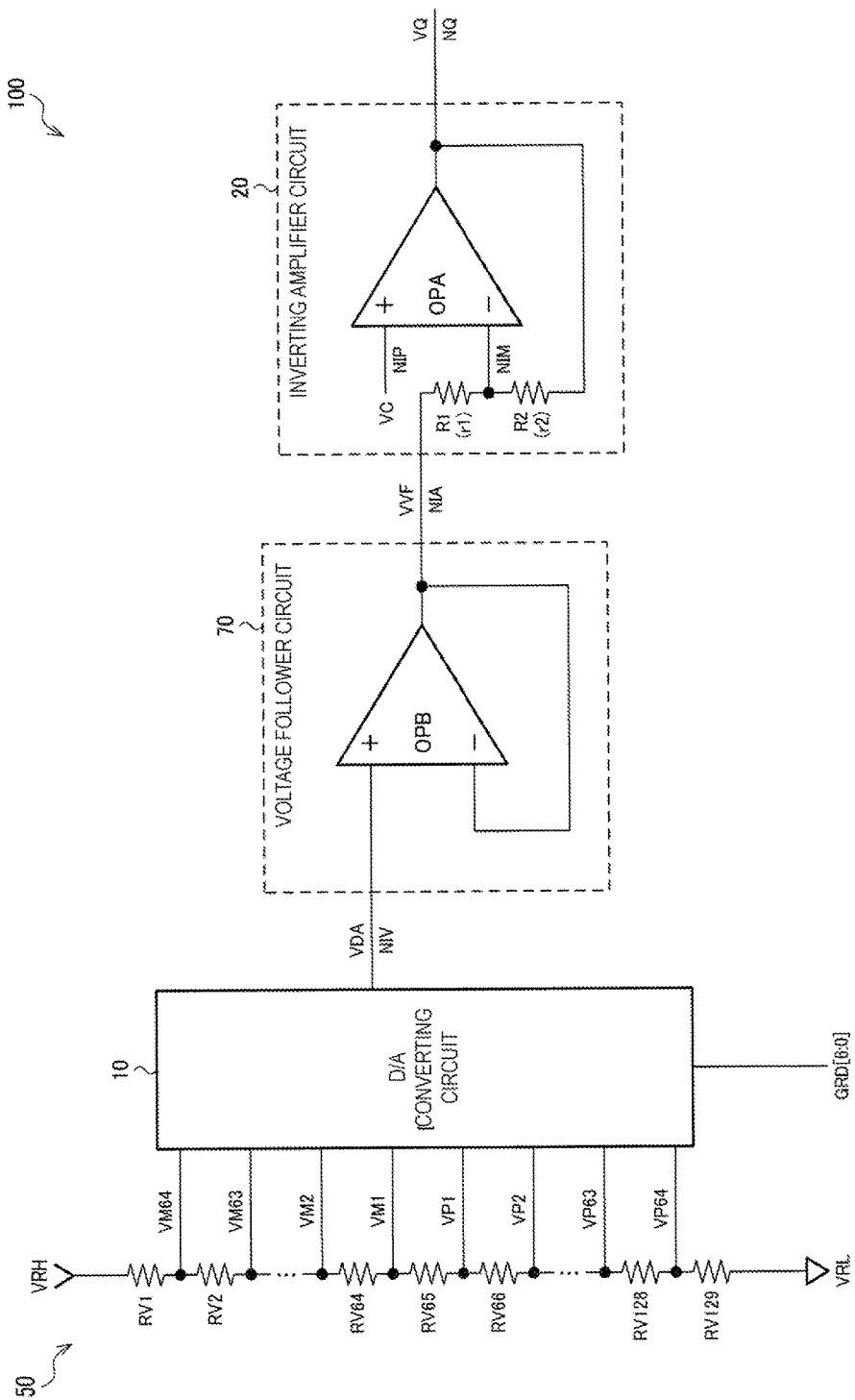
FIG. 11 is a second configuration example of the display driver in one exemplary embodiment.

FIG. 11 is a second configuration example of the display driver 100 in one exemplary embodiment. The display driver 100 in FIG. 11 includes the D/A converting circuit 10, the inverting amplifier circuit 20, and a voltage follower circuit 70. The display driver 100 may further include the ladder resistance circuit 50. Note that the same structural components described in FIG. 1 and the like have the same reference numerals, and description of the structural components will be omitted as appropriate.

The voltage follower circuit 70 receives an input of the gradation voltage VDA from the D/A converting circuit 10 and outputs a voltage VVF corresponding to the gradation voltage VDA to the input node NIA of the inverting amplifier circuit 20. Specifically, the voltage follower circuit 70 includes an operational amplifier OPB. An input node NIV of the voltage follower circuit 70 is coupled to a non-inverting input terminal of the operational amplifier OPB, and the gradation voltage VDA from the D/A converting circuit 10 is input to the input node NIV of the voltage follower circuit 70. An output terminal of the operational amplifier OPB is coupled to an inverting input terminal. The voltage VVF is identical (including substantially identical) to the gradation voltage VDA. The voltage follower circuit 70 impedance-converts (buffers) the gradation voltage VDA, outputs the voltage VVF, and then absorbs a current flowing between the input node NIA and the output node NQ of the inverting amplifier circuit 20. In a case where the output voltage VQ of the inverting amplifier circuit 20 is lower than the reference voltage VC (in the negative driving), the voltage follower circuit 70 outputs a current to the input node NIA of the inverting amplifier circuit 20. On the other hand, in a case where the output voltage VQ of the inverting amplifier circuit 20 is higher than the reference voltage VC (in the positive driving), the voltage follower circuit 70 absorbs a current flowing from the output node NQ to the input node NIA of the inverting amplifier circuit 20.

In some exemplary embodiments described above, the voltage follower circuit 70 impedance-converts the gradation voltage VDA to output the voltage VVF to the input node NIA of the inverting amplifier circuit 20. Therefore, the current flowing between the input node NIA and the output node NQ of the inverting amplifier circuit 20 is absorbed. Thus, no current flows between the output node of the D/A converting circuit 10 and the ladder resistance circuit 50. In this way, while the inverting amplifier circuit 20, including the resistors R1 and R2, as feedback circuits, between the input node NIA and the output node NQ is adopted, an error in the gradation voltage VDA output from the D/A converting circuit 10 can be reduced (or canceled).

Further, as in FIG. 1, there are advantages of, for example, enabling the operational amplifier OPA to be highly sensitive (highly gained), eliminating a need for initialization unlike an inverting amplifier circuit, including a capacitor, as a feedback circuit, and becoming less likely to be influenced by noise than an inverting amplifier circuit including a capacitor as a feedback circuit.

6. Electro-Optical Device

Figure 12:
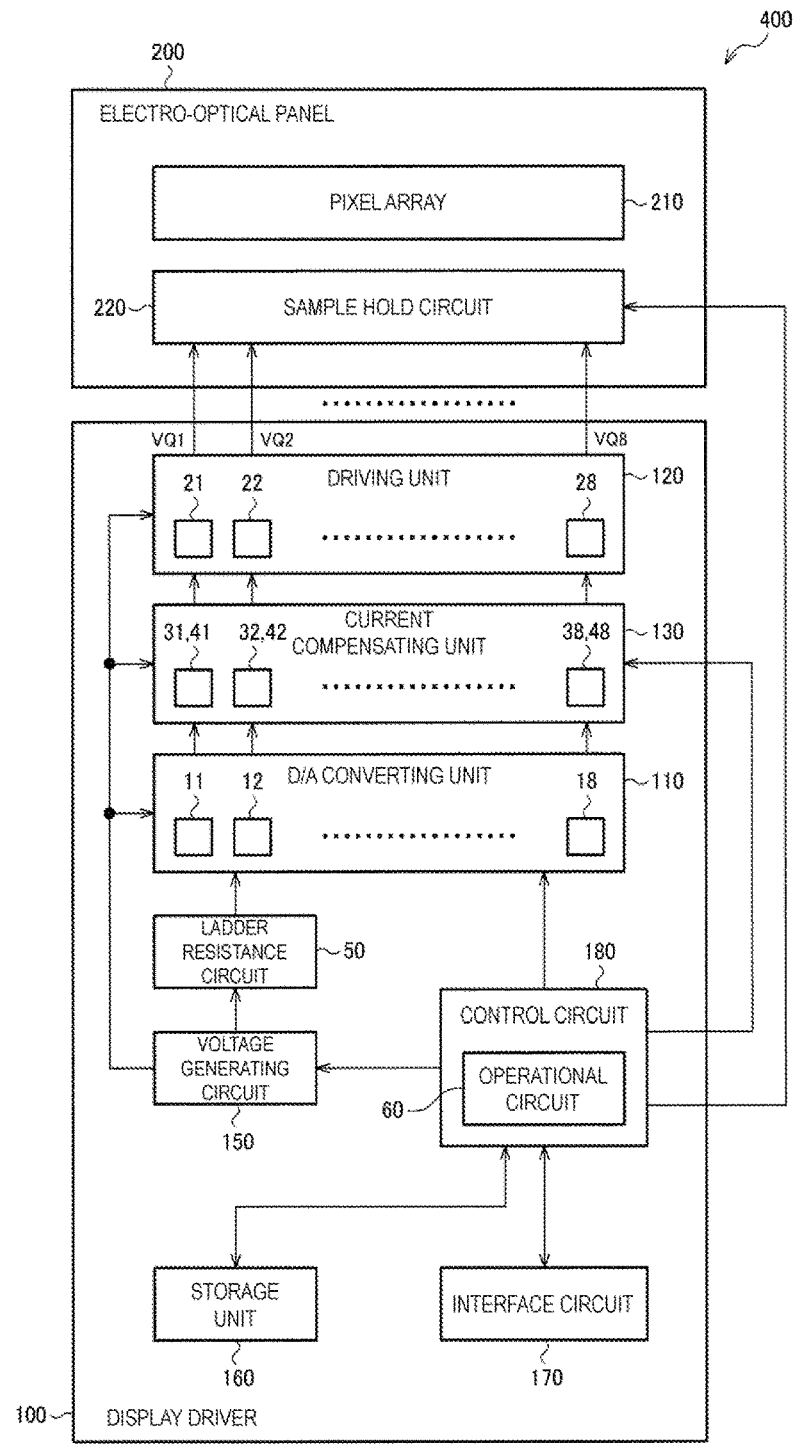
FIG. 12 is a configuration example of an electro-optical device.

FIG. 12 is a configuration example of an electro-optical device 400 including the display driver 100 in one exemplary embodiment. The electro-optical device 400 (display device) includes the display driver 100 and an electro-optical panel 200 (display panel). Note that a case where the display driver 100 performs phase evolution driving will be described as an example below. However, an application target of the disclosure is not limited to this, and the disclosure is also applicable to, for example, multiplex driving (demultiplex driving) and the like.

The electro-optical panel 200 includes a pixel array 210 and a sample hold circuit 220 (switch circuit). The electro-optical panel 200 is, for example, a liquid crystal display panel, an electro luminescence (EL) display panel, and the like.

The pixel array 210 includes a plurality of pixels disposed in an array (matrix). In the phase evolution driving, eight (k in a broad sense. k is an integer of two or more) source lines of the pixel array 210 are successively driven. Specifically, the sample hold circuit 220 serves as a circuit that samples and holds data voltages VQ1 to VQ8 from the display driver 100 to source lines of the pixel array 210. Specifically, the data voltages VQ1 to VQ8 are input to first to eighth data lines of the electro-optical panel 200. It is assumed that the pixel array 210 includes first to 640th source lines, for example. The sample hold circuit 220 couples the first to eighth data lines to the first to eighth source lines in a first period, and couples the first to eighth data lines to the ninth to sixteenth source lines in a next second period. The same applies to the following, and the sample hold circuit 220 couples the first to eighth data lines to the 633th to 640th source lines in an 80th period. Such an operation is performed in each horizontal scanning period.

The display driver 100 includes the ladder resistance circuit 50, a D/A converting unit 110 (D/A converting circuit), a driving unit 120 (drive circuit), a current compensating unit 130 (current compensating circuit), a voltage generating circuit 150, a storage unit 160 (memory), an interface circuit 170, and a control circuit 180 (controller).

Figure 13:
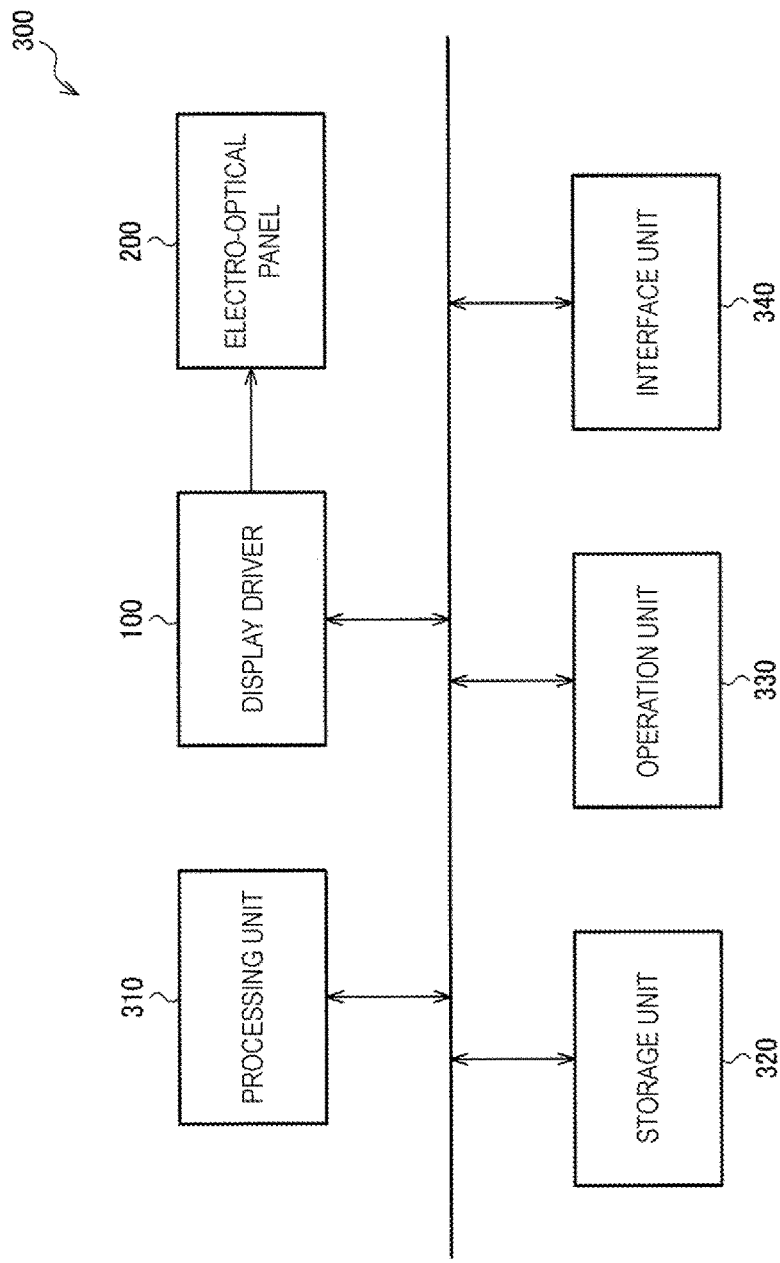
FIG. 13 is a configuration example of an electronic apparatus.

The interface circuit 170 communicates between the display driver 100 and an external processing device (for example, a processing unit 310 in FIG. 13). For example, a clock signal, a timing control signal, and display data are input from the external processing device to the control circuit 180 through the interface circuit 170.

The control circuit 180 controls components of the display driver 100 and components of the electro-optical panel 200 based on the clock signal, the timing control signal, and the display data input through the interface circuit 170. For example, the control circuit 180 controls display timing such as selection of a horizontal scanning line of the pixel array 210, vertical synchronizing control of the pixel array 210, and control of phase evolution driving (the above-mentioned first to 80th periods). Then, the control circuit 180 controls the D/A converting unit 110 and the current compensating unit 130 according to the display timing. The control circuit 180 may further include the operational circuit 60 that operates the setting data CTM and CTP for setting a current value of the compensation currents ICM and ICP.

The voltage generating circuit 150 generates various voltages and outputs the voltage to the driving unit 120 and the D/A converting unit 110. For example, the voltage generating circuit 150 generates a power source of the D/A converting unit 110, the current compensating unit 130, and the driving unit 120. The voltage generating circuit 150 is formed of, for example, a regulator and the like.

The D/A converting unit 110 includes D/A converting circuits 11 to 18. Each of the D/A converting circuits 11 to 18 has the same configuration as the configuration of the D/A converting circuit 10 described in FIG. 1 and the like. The driving unit 120 includes inverting amplifier circuits 21 to 28 (drive circuits). Each of the inverting amplifier circuits 21 to 28 has the same configuration as the configuration of the inverting amplifier circuit 20 described in FIG. 1 and the like. The D/A converting circuits 11 to 18 convert display data from the control circuit 180 from digital to analog and output the voltage converted from digital to analog to the inverting amplifier circuits 21 to 28. The inverting amplifier circuits 21 to 28 invert and amplify the voltage from the D/A converting circuits 11 to 18 and then output the data voltages VQ1 to VQ8 to the electro-optical panel 200.

The current compensating unit 130 includes current compensating circuits 31 to 38 and current compensating circuits 41 to 48. Each of the current compensating circuits 31 to 38 has the same configuration as the configuration of the current compensating circuit 30 described in FIG. 1 and the like. Each of the current compensating circuits 41 to 48 has the same configuration as the configuration of the current compensating circuit 40 described in FIG. 1 and the like. The current compensating circuits 31 to 38 compensate a current flowing from input nodes to output nodes of the inverting amplifier circuits 21 to 28. The current compensating circuits 41 to 48 compensate a current flowing from the output nodes to the input nodes of the inverting amplifier circuits 21 to 28.

The storage unit 160 stores various pieces of data (for example, setting data) used for controlling the display driver 100 and the like. For example, the storage unit 160 is formed of a non-volatile memory and RAM (such as SRAM and DRAM).

7. Electronic Apparatus

FIG. 13 is a configuration example of an electronic apparatus 300 including the display driver 100 in one exemplary embodiment. Specific examples of the electronic apparatus 300 may include various electronic apparatuses in which a display device is installed, such as a projector, a head-mounted display, a mobile information terminal, a vehicle-mounted device (for example, a meter panel, a car navigation system, and the like), a mobile game terminal, and an information processing device.

The electronic apparatus 300 includes a processing unit 310 (for example, a processor such as a CPU, a display controller, or an ASIC), a storage unit 320 (for example, a memory, a hard disk, and the like), an operation unit 330 (operation device), an interface unit 340 (interface circuit, interface device), the display driver 100, and the electro-optical panel 200.

The operation unit 330 is a user interface that receives various operations from a user. For example, the operation unit 330 is a button, a mouse, a keyboard, and a touch panel attached to the electro-optical panel 200. The interface unit 340 is a data interface that inputs and outputs image data and control data. For example, the interface unit 340 is a wired communication interface such as a USB or a wireless communication interface such as a wireless LAN. The storage unit 320 stores data input from the interface unit 340. Alternatively, the storage unit 320 functions as a working memory of the processing unit 310. The processing unit 310 processes display data input from the interface unit 340 or stored in the storage unit 320 and then transfers the display data to the display driver 100. The display driver 100 displays an image on the electro-optical panel 200 based on the display data transferred from the processing unit 310.

For example, in a case where the electronic apparatus 300 is a projector, the electronic apparatus 300 further includes a light source and an optical device (for example, a lens, a prism, a mirror, and the like). In a case where the electro-optical panel 200 is transmissive, an optical device causes light from a light source to enter the electro-optical panel 200 and projects light passing through the electro-optical panel 200 onto a screen (display section). In a case where the electro-optical panel 200 is reflective, an optical device causes light from a light source to enter the electro-optical panel 200 and projects light reflected by the electro-optical panel 200 onto a screen (display section).

Note that although some exemplary embodiments are described above in detail, it can be understood by those skilled in the art that many modifications can be achieved without substantially departing from new matters and effects of the disclosure. Therefore, all of the modified examples are assumed to be included within the scope of the disclosure. For example, a term described with a different term in a broad sense or in the same sense at least once in the description or the drawings can be replaced with the different term in any places of the description or the drawings. Further, all combinations of each exemplary embodiment and the modified examples are also included within the scope of the disclosure. The configurations and the operations of the display driver, the electro-optical panel, the electro-optical device, and the electronic apparatus are not limited to those described in some exemplary embodiments, and various modifications can be achieved.

What is claimed is:

1. A display driver comprising:
    a digital-to-analog (D/A) converting circuit configured to convert display data into a gradation voltage;
    an inverting amplifier circuit including:
        an operational amplifier including a non-inverting input terminal to which a reference voltage is input,
        a first resistor provided between an input node to which the gradation voltage is input and an inverting input terminal of the operational amplifier, and
        a second resistor provided between an output terminal of the operational amplifier and the inverting input terminal;
    a first current compensating circuit provided between the input node of the inverting amplifier circuit and a first node of a first supply voltage, and configured to cause a first compensation current to flow from the first node of the first supply voltage to the input node of the inverting amplifier circuit; and
    a second current compensating circuit provided between the input node of the inverting amplifier circuit and a second node of a second supply voltage, the second supply node being lower than the first supply voltage, and configured to cause a second compensation current to flow from the input node of the inverting amplifier circuit to the second node of the second supply voltage.

2. The display driver according to claim 1, wherein
    the first current compensating circuit causes the first compensation current to flow, in a case where an output voltage of the inverting amplifier circuit is lower than the reference voltage, and
    the second current compensating circuit causes the second compensation circuit to flow, in a case where the output voltage of the inverting amplifier circuit is higher than the reference voltage.

3. The display driver according to claim 2, wherein
    the first current compensating circuit causes the first compensation current having a current value increased with an increased difference between the output voltage of the inverting amplifier circuit and the reference voltage to flow, in a case where the output voltage of the inverting amplifier circuit is lower than the reference voltage, and
    the second current compensating circuit causes the second compensation circuit having a current value increased with an increased difference between the output voltage of the inverting amplifier circuit and the reference voltage to flow, in a case where the output voltage of the inverting amplifier circuit is higher than the reference voltage.

4. An electro-optical device comprising:
    the display driver according to claim 3; and
    an electro-optical panel configured to be driven by the display driver.

5. An electronic apparatus comprising:
    the display driver according to claim 3.

6. An electro-optical device comprising:
    the display driver according to claim 2; and
    an electro-optical panel configured to be driven by the display driver.

7. An electronic apparatus comprising:
    the display driver according to claim 2.

8. The display driver according to claim 1, further comprising:
    an operational circuit configured to perform operational processing based on the display data and output first setting data for setting a current value of the first compensation current and second setting data for setting a current value of the second compensation current, wherein
    the first current compensating circuit outputs the first compensation current having a current value set by the first setting data, and
    the second current compensating circuit outputs the second compensation current having a current value set by the second setting data.

9. The display driver according to claim 8, wherein
    the operational circuit outputs the first setting data for increasing a current value of the first compensation current with an increased difference between a gradation value of the display data and a gradation value corresponding to the reference voltage in a positive period of polarity inversion driving, and outputs the second setting data for increasing a current value of the second compensation current with an increased difference between a gradation value of the display data and a gradation value corresponding to the reference voltage in a negative period of the polarity inversion driving.

10. An electro-optical device comprising:
    the display driver according to claim 9; and
    an electro-optical panel configured to be driven by the display driver.

11. An electro-optical device comprising:
    the display driver according to claim 8; and
    an electro-optical panel configured to be driven by the display driver.

12. An electronic apparatus comprising:
    the display driver according to claim 8.

13. The display driver according to claim 1, further comprising:
    a ladder resistance circuit configured to generate a plurality of voltages, wherein
    the D/A converting circuit selects a voltage corresponding to the display data from the plurality of voltages, and outputs the voltage as the gradation voltage.

14. An electro-optical device comprising:
    the display driver according to claim 13; and
    an electro-optical panel configured to be driven by the display driver.

15. The display driver according to claim 1, wherein the operational amplifier includes
a first transistor and a second transistor constituting a differential pair,
a third transistor and a fourth transistor constituting a current mirror circuit,
a fifth transistor that is provided between the first transistor and the third transistor and includes a gate to which a given bias voltage is input, and
a sixth transistor that is provided between the second transistor and the fourth transistor and includes a gate to which the given bias voltage is input.

16. An electro-optical device comprising:
the display driver according to claim 15; and
an electro-optical panel configured to be driven by the display driver.

17. An electro-optical device comprising:
the display driver according to claim 1; and
an electro-optical panel configured to be driven by the display driver.

18. An electronic apparatus comprising:
the display driver according to claim 1.

\* \* \* \* \*